United States Patent
Tian et al.

(10) Patent No.: US 10,566,828 B2
(45) Date of Patent: *Feb. 18, 2020

(54) ADAPTER AND CHARGING CONTROL METHOD

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/570,519

(22) PCT Filed: Jan. 7, 2017

(86) PCT No.: PCT/CN2017/070520
§ 371 (c)(1),
(2) Date: Oct. 30, 2017

(87) PCT Pub. No.: WO2017/133382
PCT Pub. Date: Aug. 10, 2017

(65) Prior Publication Data
US 2018/0342890 A1 Nov. 29, 2018

Related U.S. Application Data

(63) Continuation-in-part of application No. PCT/CN2016/073679, filed on Feb. 5, 2016.

(30) Foreign Application Priority Data

Jul. 26, 2016 (CN) .......................... 2016 1 0600612

(51) Int. Cl.
*H02J 7/02* (2016.01)
*G01R 31/3842* (2019.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ........ H02J 7/027; H02J 7/0052; H02J 7/0029; H02J 7/0031; H02J 7/007; H02J 7/04;
(Continued)

(56) References Cited

U.S. PATENT DOCUMENTS

| 4,087,733 | A | 5/1978 | Casagrande |
| 5,614,805 | A | 3/1997 | Momotani |

(Continued)

FOREIGN PATENT DOCUMENTS

| CN | 1079603 | C | 2/2002 |
| CN | 1564421 | A | 1/2005 |

(Continued)

OTHER PUBLICATIONS

European Patent Application No. 17746702.4 extended Search and Opinion dated May 2, 2018, 9 pages.

(Continued)

*Primary Examiner* — M Baye Diao
(74) *Attorney, Agent, or Firm* — Lathrop GPM LLP

(57) ABSTRACT

An adapter, a charging control method and a charging system are provided. The adapter includes: a power converter, configured to convert input alternating current to obtain an output voltage and an output current of the adapter, the output current of the adapter being a current with a first pulsating waveform; a sampling and holding unit, coupled to the power converter, and configured to sample the current (Continued)

with the first pulsating waveform in a sampling state, and to hold a peak value of the current in a holding state; a current sampling controller, coupled to the sampling and holding unit, and configured to determine whether the sampling and holding unit is in the holding state, and to sample the peak value of the current with the first pulsating waveform held by the sampling and holding unit when the sampling and holding unit is in the holding unit.

19 Claims, 15 Drawing Sheets

(51) Int. Cl.
| | |
|---|---|
| H02M 3/335 | (2006.01) |
| H02J 7/00 | (2006.01) |
| H02J 7/04 | (2006.01) |
| H02M 7/217 | (2006.01) |
| H02J 7/06 | (2006.01) |
| H02M 1/08 | (2006.01) |
| H02M 7/06 | (2006.01) |
| H01M 10/0525 | (2010.01) |
| H01M 10/42 | (2006.01) |
| H01M 10/44 | (2006.01) |
| H02M 1/44 | (2007.01) |
| H02M 5/04 | (2006.01) |
| H02M 7/04 | (2006.01) |
| H02M 1/00 | (2006.01) |
| H02J 7/10 | (2006.01) |

(52) U.S. Cl.
CPC ......... *H01M 10/425* (2013.01); *H01M 10/44* (2013.01); *H02J 7/007* (2013.01); *H02J 7/008* (2013.01); *H02J 7/0029* (2013.01); *H02J 7/0031* (2013.01); *H02J 7/0052* (2013.01); *H02J 7/0093* (2013.01); *H02J 7/022* (2013.01); *H02J 7/04* (2013.01); *H02J 7/041* (2013.01); *H02J 7/045* (2013.01); *H02J 7/047* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 2010/4271* (2013.01); *H02J 2007/0039* (2013.01); *H02J 2007/0059* (2013.01); *H02J 2007/0062* (2013.01); *H02J 2007/0096* (2013.01); *H02J 2007/0098* (2013.01); *H02J 2007/10* (2013.01); *H02M 2001/0009* (2013.01)

(58) Field of Classification Search
CPC .... H02J 7/06; H02J 7/022; H02J 7/008; H02J 7/047; H02J 7/045; H02J 7/041; H02J 7/0093; G01R 31/3842; H02M 7/04; H02M 5/04; H02M 1/44; H02M 7/06; H02M 3/33569; H02M 3/33523; H02M 3/33592; H02M 1/08; H02M 7/217; H02M 3/33576; H01M 10/44; H01M 10/425; H01M 10/0525; H01M 3/33507; H01M 3/335
USPC ................................................. 320/136, 137
See application file for complete search history.

(56) References Cited

U.S. PATENT DOCUMENTS

| | | | |
|---|---|---|---|
| 6,075,340 A | 6/2000 | Koenck | |
| 6,137,265 A | 10/2000 | Cummings et al. | |
| 7,002,265 B2 * | 2/2006 | Potega | G01R 31/36 307/149 |
| 2003/0151928 A1 * | 8/2003 | Kobori | H02M 3/28 363/21.01 |
| 2004/0090209 A1 | 5/2004 | Nishida et al. | |
| 2006/0284595 A1 | 12/2006 | Hsieh et al. | |
| 2007/0040516 A1 * | 2/2007 | Chen | H05B 39/045 315/291 |
| 2007/0138971 A1 * | 6/2007 | Chen | H05B 39/045 315/209 R |
| 2008/0197811 A1 | 8/2008 | Hartular et al. | |
| 2010/0097033 A1 * | 4/2010 | Tange | H02J 7/0026 320/116 |
| 2010/0188052 A1 | 7/2010 | Su et al. | |
| 2012/0161521 A1 | 6/2012 | Li et al. | |
| 2013/0141034 A1 | 6/2013 | Huang et al. | |
| 2014/0139177 A1 | 5/2014 | Li | |
| 2014/0159641 A1 | 6/2014 | Geren | |
| 2015/0180356 A1 * | 6/2015 | Norisada | H02M 3/33546 363/17 |
| 2017/0187215 A1 | 6/2017 | Noda et al. | |

FOREIGN PATENT DOCUMENTS

| | | |
|---|---|---|
| CN | 101022179 A | 8/2007 |
| CN | 102055344 A | 5/2011 |
| CN | 202026118 U | 11/2011 |
| CN | 102364848 A | 2/2012 |
| CN | 102545360 A | 7/2012 |
| CN | 103762702 A | 4/2014 |
| CN | 103795040 A | 5/2014 |
| CN | 203981764 U | 12/2014 |
| CN | 104810877 A | 7/2015 |
| CN | 104810879 A | 7/2015 |
| CN | 104967201 A | 10/2015 |
| CN | 105472827 A | 4/2016 |
| CN | 105991018 A | 10/2016 |
| CN | 106026327 A | 10/2016 |
| CN | 106253428 A | 12/2016 |
| CN | 106297726 A | 1/2017 |
| EP | 2228884 A2 | 9/2010 |
| EP | 2887492 A2 | 6/2015 |
| EP | 2930589 A1 | 10/2015 |
| EP | 2980958 A1 | 2/2016 |
| JP | S61244267 A | 10/1986 |
| JP | H03189569 A | 8/1991 |
| JP | H05103430 A | 4/1993 |
| JP | 2000275282 A | 10/2000 |
| JP | 2002281119 A | 9/2002 |
| JP | 2010040499 A | 2/2010 |
| JP | 2013198262 A | 9/2013 |
| JP | 5454781 B2 | 3/2014 |
| JP | 2014161146 A | 9/2014 |
| TW | 200737648 A | 10/2007 |
| TW | 200910041 A | 3/2009 |
| TW | 201117518 A1 | 5/2011 |
| TW | 201524105 A | 6/2015 |
| TW | 201601433 A | 1/2016 |
| TW | I525959 B | 3/2016 |
| WO | WO 2012167677 A1 | 12/2012 |
| WO | WO 2013114497 A1 | 8/2013 |
| WO | WO 2015113341 A1 | 8/2015 |
| WO | WO 2015113349 A1 | 8/2015 |

OTHER PUBLICATIONS

Taiwan Patent Application No. 10720242600 Office Action dated Mar. 21, 2018, 4 pages.
PCT/CN2017/070520 English translation of the International Search Report dated Jun. 30, 2017, 4 pages.

(56) References Cited

OTHER PUBLICATIONS

Australian Patent Application No. 2016291545 Office Action dated Jun. 25, 2018, 6 pages.
European Patent Application No. 16819788.7 extended Search and Opinion dated Nov. 15, 2017, 7 pages.
Korean Patent Application No. 20177002310 Office Action dated Jan. 29, 2018, 5 pages.
Korean Patent Application No. 20177002310 English translation of Office Action dated Jan. 29, 2018, 3 pages.
Korean Patent Application No. 20177002310 Office Action dated Jun. 26, 2018, 3 pages.
Korean Patent Application No. 20177002310 English translation of Office Action dated Jun. 26, 2018, 3 pages.
Singapore Patent Application No. 11201700428U Search and Opinion dated Nov. 23, 2017, 9 pages.
Taiwan Patent Application No. 105120040 Office Action dated Aug. 8, 2017, 11 pages.
Taiwan Patent Application No. 105120040 Decision to Grant Patent dated Mar. 22, 2018, 2 pages.
PCT/CN2016/073679 International Search Report and Written Opinion dated Nov. 10, 2016, 12 pages.
PCT/CN2016/073679 English translation of International Search Report and Written Opinion dated Nov. 10, 2016, 8 pages.
Chen, Liang-Rui, 'A Design of an Optimal Battery Pulse Charge System by Frequency-Varied Technique', IEEE Transactions on Industrial Electronics, vol. 54, No. 1, Feb. 2007, pp. 398-405, cited in office action in AU application No. 2016291545.
European Patent Application No. 17746702.4 Office Action dated Jun. 13, 2019, 6 pages.
European Patent Application No. 17746703.2, extended Search and Opinion dated May 2, 2018, 9 pages pages.
European Patent Application No. 17746703.2, Office Action dated Dec. 20, 2018, 6 pages.
European Patent Application No. 17746703.2, Office Action dated Mar. 25, 2019 5 pages.
Japanese Patent Application No. 2017-557443, Office Action dated Jun. 5, 2018, 4 pages.
Japanese Patent Application No. 2017-557443, English translation of Office Action dated Jun. 5, 2018, 4 pages.
PCT/CN2017/070521 International Search Report and Written Opinion dated May 23, 2017, 13 pages.
PCT/CN2017/070521 English translation of International Search Report and Written Opinion dated May 23, 2017, 8 pages.
Taiwan Patent Application No. 106124400, Office Action dated Mar. 28, 2018, 3 pages.
Taiwan Patent Application No. 106124400, English translation of Office Action dated Mar. 28, 2018, 3 pages.

\* cited by examiner

ADAPTER AND CHARGING CONTROL METHOD

CROSS-REFERENCE TO RELATED APPLICATIONS

This application is a US national phase application of International Application No. PCT/CN2017/070520, filed on Jan. 7, 2017, which claims priority to International Application No. PCT/CN2016/073679, filed on Feb. 5, 2016, and Chinese Patent Application No. 201610600612.3, filed on Jul. 26, 2016, the entire contents of which are incorporated herein by reference.

TECHNICAL FIELD

The present disclosure generally relates to a charging field, and more particularly, to an adapter, a charging control method and a charging system.

BACKGROUND

An adapter is also known as a power adapter, and is configured to charge a device to be charged such as a terminal. The adapter now on the market generally charges the device to be charged such as the terminal in a constant voltage mode. Since a battery in the device to be charged is typically a lithium battery, it is easy to cause a lithium precipitation when the device to be charged is charged in the constant voltage mode, thus reducing a service life of the battery.

SUMMARY

Embodiments of the present disclosure provide an adapter and a charging control method, which reduces a lithium precipitation of a battery, and improves a service life of the battery.

Embodiments of the present disclose provide an adapter. The adapter supports a first charging mode and a second charging mode, in which the first charging mode is a constant voltage mode, the second charging mode is a constant current mode. In the second charging mode, an output voltage of the adapter is directly applied to both ends of a battery of a device to be charged and an output current of the adapter is made to directly pass through the battery for direct charging of the battery. The adapter includes: a power converter, configured to convert input alternating current to obtain an output voltage and an output current of the adapter, wherein the output current of the adapter is a current with a first pulsating waveform; a sampling and holding unit, coupled to the power converter, and configured to sample the current with the first pulsating waveform in a sampling state, and to hold a peak value of the current with the first pulsating waveform in a holding state; a current sampling controller, coupled to the sampling and holding unit, and configured to determine whether the sampling and holding unit is in the holding state, and to sample the peak value of the current with the first pulsating waveform held by the sampling and holding unit when the sampling and holding unit is in the holding unit.

Embodiments of the present disclose provide a charging control method. The method is applied in an adapter, and the adapter supports a first charging mode and a second charging mode, in which the first charging mode is a constant voltage mode, and the second charging mode is a constant current mode. In the second charging mode, an output voltage of the adapter is directly applied to both ends of a battery of a device to be charged and an output current of the adapter is made to directly pass through the battery for direct charging of the battery. The adapter includes a power converter and a sampling and holding unit. The power converter is configured to convert input alternating current to obtain an output voltage and an output current of the adapter, in which the output current of the adapter is a current with a first pulsating waveform. The sampling and holding unit is coupled to the power converter, and configured to sample the current with the first pulsating waveform in a sampling state, and to hold a peak value of the current with the first pulsating waveform in a holding state. The method includes: determining whether the sampling and holding unit is in the holding state; and sampling the peak value of the current with the first pulsating waveform held by the sampling and holding unit when determining that the sampling and holding unit is in the holding state.

Embodiments of the present disclose provide a charging system including an adapter and a device to be charged. The adapter supports a first charging mode and a second charging mode, in which the first charging mode is a constant voltage mode, the second charging mode is a constant current mode. In the second charging mode, an output voltage of the adapter is directly applied to both ends of a battery of a device to be charged and an output current of the adapter is made to directly pass through the battery for direct charging of the battery. The adapter includes: a power converter, configured to convert input alternating current to obtain an output voltage and an output current of the adapter, wherein the output current of the adapter is a current with a first pulsating waveform; a sampling and holding unit, coupled to the power converter, and configured to sample the current with the first pulsating waveform in a sampling state, and to hold a peak value of the current with the first pulsating waveform in a holding state; a current sampling controller, coupled to the sampling and holding unit, and configured to determine whether the sampling and holding unit is in the holding state, and to sample the peak value of the current with the first pulsating waveform held by the sampling and holding unit when the sampling and holding unit is in the holding unit.

BRIEF DESCRIPTION OF THE DRAWINGS

In order to make technique solutions according to embodiments of the present disclosure more apparent, drawings needed to be used in descriptions of the embodiments will be illustrated in the following. Obviously, the drawings to be illustrated in the following only represent some embodiments of the present disclosure, and other drawings can be obtained according these drawings by those having ordinary skills in the related art without making creative labors.

DETAILED DESCRIPTION

Figure 1:
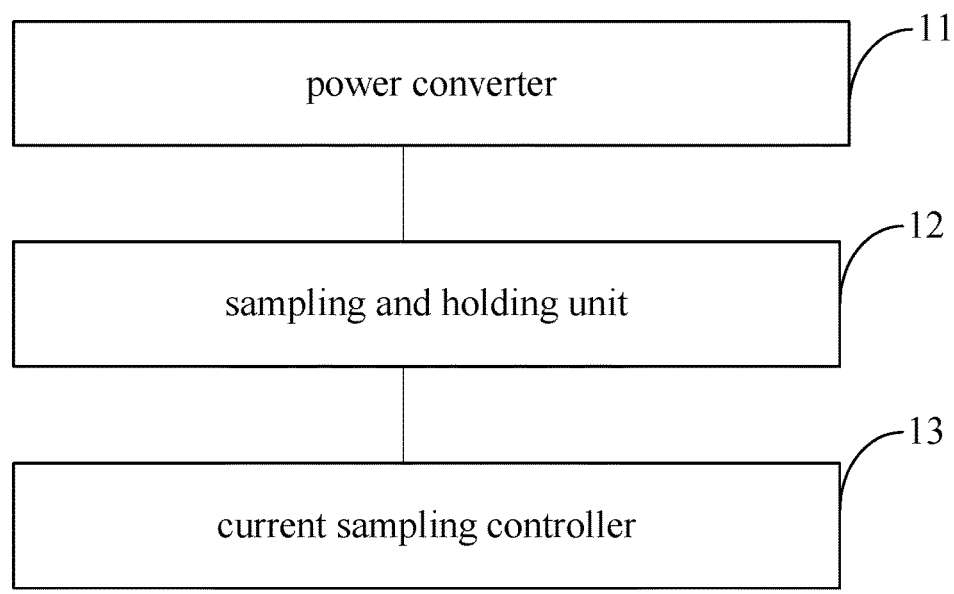
FIG. 1 is a block diagram of a second adapter according to an embodiment of the present disclosure.

Descriptions will be made in detail to embodiments of the present disclosure, examples of which are illustrated in drawings, in which the same or similar elements and the elements having same or similar functions are denoted by like reference numerals throughout the descriptions. The embodiments described herein with reference to drawings are explanatory, are intended to understand the present disclosure, and are not construed to limit the present disclosure.

In the related art, a first adapter for charging a device to be charged such as a terminal is provided. The first adapter works in a constant voltage mode. In the constant voltage mode, the voltage outputted by the first adapter keeps substantially constant, for example, 5V, 9V, 12V or 20V.

The voltage outputted by the first adapter is not suitable for being directly applied to both ends of a battery. Instead, the voltage outputted by the first adapter needs to be converted by a conversion circuit in the device to be charged such as the terminal, such that a charging voltage and/or a charging current expected by the battery in the device to be charged such as the terminal is obtained.

The conversion circuit is configured to convert the voltage outputted by the first adapter, to meet a requirement of the charging voltage and/or charging current expected by the battery.

As an example, the conversion circuit may be a charging management module, such as a charging integrated circuit (IC). During a charging process of the battery, the conversion circuit may be configured to manage the charging voltage and/or charging current of the battery. The conversion circuit may have at least one of a voltage feedback function and a current feedback function, so as to manage the charging voltage and/or charging current of the battery.

For example, the charging process of the battery may include at least one of a trickle charging stage, a constant current charging stage and a constant voltage charging stage. In the trickle charging stage, the conversion circuit may utilize a current feedback loop to ensure that a current flowing into the battery in the trickle charging stage meets the charging current (such as a first charging current) expected by the battery. In the constant current charging stage, the conversion circuit may utilize a current feedback loop to ensure that the current flowing into the battery in the constant current charging stage meets the charging current (such as a second charging current, which may be greater than the first charging current) expected by the battery. In the constant voltage charging stage, the conversion circuit may utilize a voltage feedback loop to ensure that a voltage applied to both ends of the battery in the constant voltage charging stage meets the charging voltage expected by the battery.

As an example, when the voltage outputted by the first adapter is greater than the charging voltage expected by the battery, the conversion circuit may be configured to perform a buck conversion on the voltage outputted by the first adapter to enable a buck-converted charging voltage to meet the requirement of the charging voltage expected by the battery. As another example, when the voltage outputted by the first adapter is less than the charging voltage expected by the battery, the conversion circuit may be configured to perform a boost conversion on the voltage outputted by the first adapter to enable a boost-converted charging voltage to meet the requirement of the charging voltage expected by the battery.

As another example, assume that the first adapter outputs a constant voltage of 5V. When the battery includes a single battery cell (such as a lithium battery cell, a charging cut-off voltage of a single battery cell is typically 4.2V), the conversion circuit (for example, a buck circuit) may perform a buck conversion on the voltage outputted by the first adapter, such that the charging voltage obtained after the buck conversion meets a requirement of the charging voltage expected by the battery.

As yet another example, assume that the first adapter outputs a constant voltage of 5V. When the first adapter charges a plurality of (two or more) battery cells (such as lithium battery cell, a charging cut-off voltage of a single battery cell is typically 4.2V) coupled in series, the conversion circuit (for example, a boost circuit) may perform a boost conversion on the voltage outputted by the first adapter, such that the charging voltage obtained after the boost conversion meets a requirement of the charging voltage expected by the battery.

Limited by a poor conversion efficiency of the conversion circuit, a part of electric energy is lost in a form of heat, and the heat may gather inside the device to be charged such as the terminal. A design space and a space for heat dissipation of the device to be charged such as the terminal are small (for example, the physical size of a mobile terminal used by a user becomes thinner and thinner, while plenty of electronic elements are densely arranged in the mobile terminal to improve performance of the mobile terminal), which not only increases difficulty in designing the conversion circuit, but also results in that it is hard to dissipate the heat gathered in the device to be charged such as the terminal in time, thus further causing an abnormity of the device to be charged such as the terminal.

For example, the heat gathered on the conversion circuit may cause a thermal interference on electronic elements neighboring the conversion circuit, thus causing abnormal operations of the electronic elements. For another example, the heat gathered on the conversion circuit may shorten the service life of the conversion circuit and neighboring electronic elements. For yet another example, the heat gathered on the conversion circuit may cause a thermal interference on the battery, thus causing abnormal charging and/or abnormal discharging of the battery. For still another example, the heat gathered on the conversion circuit may increase the temperature of the device to be charged such as the terminal, thus affecting user experience during the charging. For still yet another example, the heat gathered on the conversion circuit may short-circuit the conversion circuit, such that the voltage outputted by the first adapter is directly applied to both ends of the battery, thus causing abnormal charging of the battery, which brings safety hazard if the over-voltage charging lasts for a long time, for example, the battery may explode.

Embodiments of the present disclosure provide a second adapter, an output voltage of which is adjustable. The second adapter can obtain status information of the battery. The status information of the battery may include electric quantity information and/or voltage information of the battery. The second adapter adjusts the voltage outputted by itself according to the obtained status information of the battery, to meet the requirement of the charging voltage and/or charging current expected by the battery. Further, in the constant current charging stage of the charging process of the battery, the voltage outputted by the second adapter after the adjustment may be directly applied to both ends of the battery for charging the battery.

The second adapter may have a voltage feedback function and a current feedback function, so as to manage the charging voltage and/or charging current of the battery.

The second adapter may adjust the voltage outputted by itself according to the obtained status information of the battery as follows. The second adapter may obtain the status information of the battery in real time, and adjust the voltage outputted by itself according to the status information of the battery obtained in real time, to meet the charging voltage and/or charging current expected by the battery.

The second adapter may adjust the voltage outputted by itself according to the status information of the battery obtained in real time as follows. During the charging process, with the increasing of the voltage of the battery, the second adapter may obtain status information of the battery at different time points in the charging process, and adjust the voltage outputted by itself in real time according to the status information of the battery at different time points in the charging process, to meet the requirement of the charging voltage and/or charging current expected by the battery.

For example, the charging process of the battery may include at least one of a trickle charging stage, a constant current charging stage and a constant voltage charging stage. In the trickle charging stage, the second adapter may utilize a current feedback loop to ensure that the current outputted by the second adapter and flowing into the battery in the trickle charging stage meets the requirement of the charging current expected by the battery (such as a first charging current). In the constant current charging stage, the second adapter may utilize a current feedback loop to ensure that the current outputted by the second adapter and flowing into the battery in the constant current charging stage meets the requirement of the charging current expected by the battery (such as a second charging current, which may be greater than the first charging current). Moreover, in the constant current charging stage, the second adapter can directly apply the charging voltage outputted by itself to both ends of the battery for charging the battery. In the constant voltage charging stage, the second adapter may utilize a voltage feedback loop to ensure that a voltage outputted by the second adapter in the constant voltage charging stage meets the requirement of the charging voltage expected by the battery.

For the trickle charging stage and the constant voltage charging stage, the voltage outputted by the second adapter may be processed in a way similar to that of the first adapter, i.e., is converted by the conversion circuit in the device to be charged such as the terminal, to obtain the charging voltage and/or charging current expected by the battery in the device to be charged such as the terminal.

In embodiments of the present disclosure, in order to improve a reliability and safety of the charging process of the battery, the second adapter is controlled to output a voltage/current with a pulsating waveform. In the following, the second adapter according to embodiments of the present disclosure will be described in detail with reference to FIG. 1.

FIG. 1 is a block diagram of a second adapter according to an embodiment of the present disclosure. The second adapter 10 in FIG. 1 includes a power converter 11, a sampling and holding unit 12 and a current sampling controller 13.

The power converter 11 is configured to convert input alternating current to obtain an output voltage and an output current of the second adapter 10. The output current of the second adapter 10 is a current with a first pulsating waveform.

The sampling and holding unit 12 is coupled with the power converter 11. When the sampling and holding unit 12 is in a sampling state, the sampling and holding unit 12 is configured to sample the current with the first pulsating waveform. When the sampling and holding unit 12 is in a holding state, the sampling and holding unit 12 is configured to hold (or lock) a peak value of the current with the first pulsating waveform.

The current sampling controller 13 is coupled with the sampling and holding unit 12. The current sampling controller 13 is configured to determine whether the sampling and holding unit 12 is in the holding state, and to sample the peak value of the current with the first pulsating waveform held by the sampling and holding unit 12 when determining that the sampling and holding unit 12 is in the holding state.

According to embodiments of the present disclosure, the output current of the second adapter is the current with the pulsating waveform (or referred to as the pulsating direct current), which can reduce the lithium precipitation of the battery. Moreover, the current with the pulsating waveform can reduce a probability and intensity of arc of a contact of a charging interface, and can prolong a service life of the charging interface.

Typically, the second adapter may adjust the output current of itself according to actual situations. Taking the second adapter supporting the constant current mode as an example, the second adapter may typically continuously adjust the output current of itself based on the voltage of the battery in the device to be charged such as the terminal, to charge the battery in a multi-stage constant current mode. Thus, during the charging process, it requires to detect and control the output current of the second adapter in real time. When the current value of the output current of the second adapter is constant, it is easy to realize the detection and control of the output current of the second adapter. However, in embodiments of the present disclosure, the output current of the second adapter is the current having the first pulsating waveform, a magnitude of which is varying, and thus it is required to design a special way for detecting and controlling the output current of the second adapter.

For this, in embodiments of the present disclosure, the sampling and holding unit 12 and the current sampling controller 13 are introduced. Based on the sampling and holding unit 12 and the current sampling controller 13, the peak value of the output current of the second adapter can be sampled, and thus the efficient control on the output current of the second adapter can be ensured.

Figure 2A:
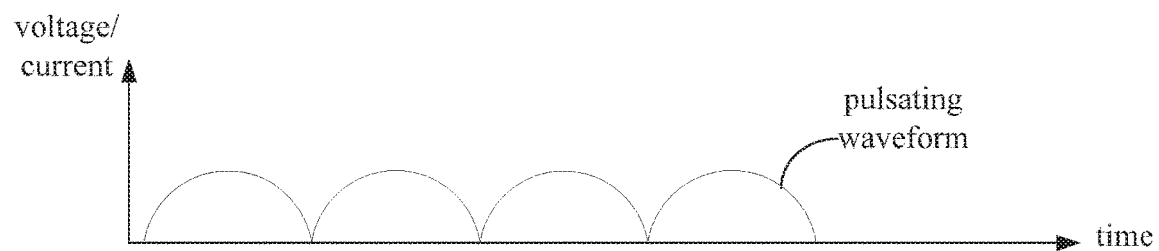
FIG. 2A and FIG. 2B are schematic diagrams illustrating a ripple waveform according to an embodiment of the present disclosure.
Figure 2B:
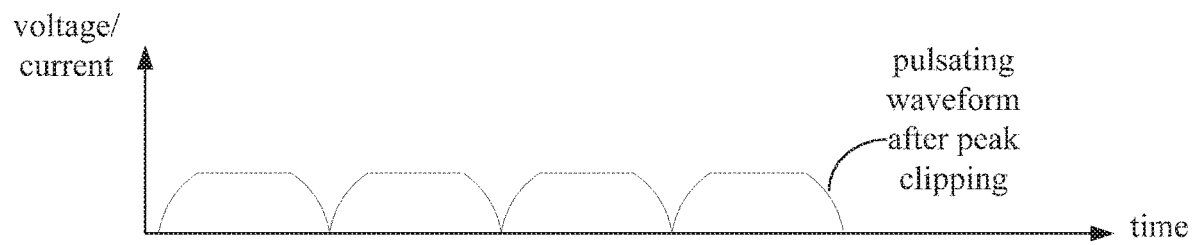

From the above, the output current of the second adapter is the current with the first pulsating waveform. In the present disclosure, the pulsating waveform may refer to an entire pulsating waveform, or may refer to a pulsating waveform obtained after performing a peak clipping process on the entire pulsating waveform. The peak clipping process may refer to filtering out a portion of the pulsating waveform which exceeds a certain threshold, thus realizing the control on the peak value of the pulsating waveform. In the embodiment illustrated in FIG. 2A, the pulsating waveform is an entire pulsating waveform. In the embodiment illustrated in FIG. 2B, the pulsating waveform is obtained after performing a peak clipping process.

It should be understood that, in embodiments of the present disclosure, the method in which the power converter 11 converts the alternating current into the current with the first pulsating waveform is not limited. For example, a primary filtering unit and a secondary filtering unit in the power converter 11 may be omitted, such that the current with the first pulsating waveform is generated. In this way, it cannot only enable the second adapter 10 to output the current with the first pulsating waveform, but can also significantly reduce the size of the second adapter 10, which is advantageous for the minimization of the second adapter 10.

The device to be charged used in embodiments of the present disclosure may be a communication terminal (or short for a terminal), which includes, but is not limited to a device configured to receive/transmit communication signals via a wired connection (for example, public switched telephone network (PSTN), digital subscriber line (DSL) connection, digital cable connection, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal). The communication terminal configured to communicate via the wireless interface may be referred to as "wireless communication terminal", "wireless terminal" and/or "mobile terminal". Examples of a mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, Internet/Intranet access, a web browser, a note pad & address book, a calendar and/or a global positioning system (GPS) receiver, and a common laptop and/or handheld receiver, or other electronic devices including a radio phone transceiver.

Figure 19A:
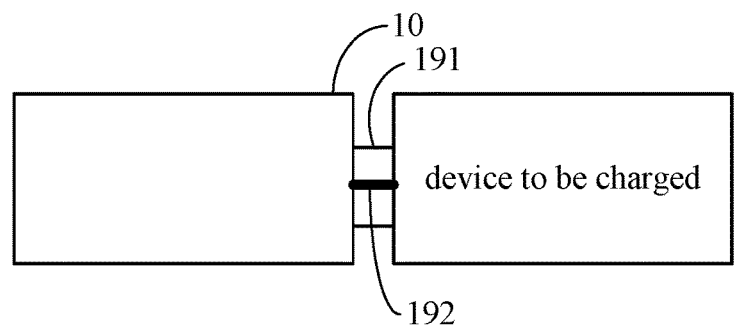
FIG. 19A is a schematic diagram illustrating a connection between a device to be charged and a second adapter according to an embodiment of the present disclosure.

In some embodiments, the second adapter 10 may include a charging interface (refer to the charging interface 191 illustrated in FIG. 19A). In embodiments of the present disclosure, a type of the charging interface is not limited. For example, the charging interface may be a universal serial bus (USB) interface, which may be a common USB interface or a micro USB interface, or a Type-C interface.

In embodiments of the present disclosure, the implementation of the sampling and holding unit 12 is not limited. Typically, the sampling and holding unit 12 can realize signal sampling and holding based on a capacitor. In the following, the implementation of the sampling and holding unit 12 will be described in detail with reference to FIG. 3.

Figure 3:
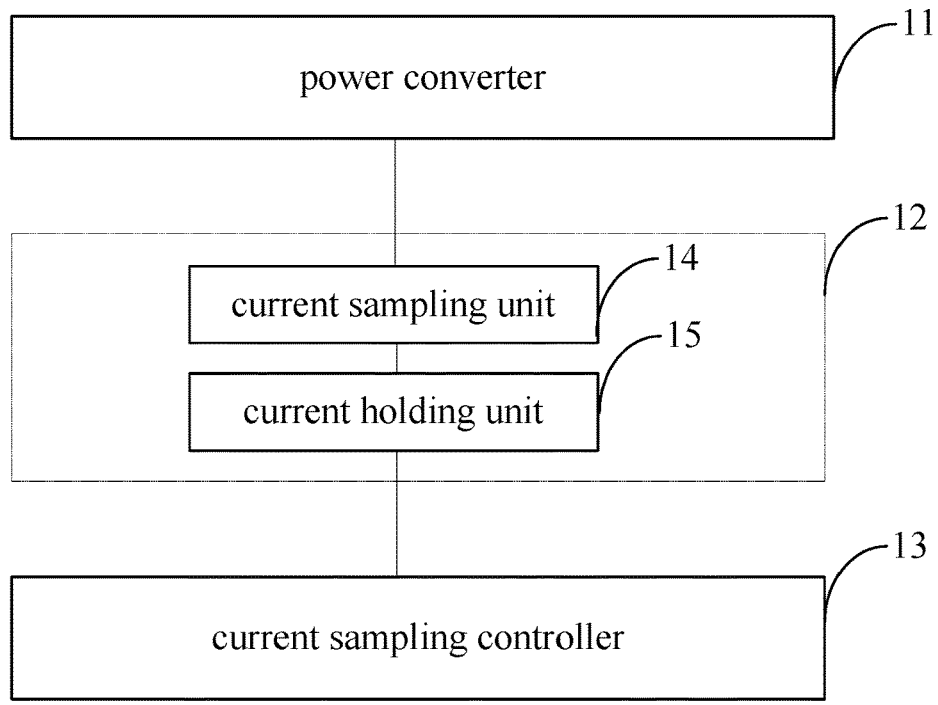
FIG. 3 is a block diagram of a second adapter according to another embodiment of the present disclosure.

Alternatively, in some embodiments, as illustrated in FIG. 3, the sampling and holding unit 12 may include a current sampling unit 14 and a current holding unit 15. The current sampling unit 14 is coupled with the power converter 11, and is configured to detect the current with the first pulsating waveform to obtain a sampling current, and to convert the sampling current into a sampling voltage. The sampling voltage is configured to indicate a magnitude of the current with the first pulsating waveform. The current holding unit 15 is coupled with the current sampling unit 14 and the current sampling controller 13 respectively. The current holding unit 15 receives the sampling voltage from the current sampling unit 14, and charges a capacitor (not illustrated in FIG. 3) in the current holding unit 15 based on the sampling voltage. The current sampling controller 13 obtains the peak value of the current with the first pulsating waveform by sampling the voltage across both ends of the capacitor in the sampling and holding unit 12.

When the first pulsating waveform is in a rising edge, the capacitor in the current holding unit 15 increases with the current value of the current with the first pulsating waveform, and the sampling and holding unit 12 is in the sampling state. When the first pulsating waveform is at the peak value or in a falling edge, the voltage across both ends of the capacitor in the current holding unit 15 keeps constant, and the sampling and holding unit 12 is in the holding state.

In embodiments of the present disclosure, the peak value of the current with the first pulsating waveform held by the sampling and holding unit 12 is sampled by the current sampling controller 13. In some embodiments, the current sampling controller 13 may include an ADC (Analog-to-Digital Converter), and the current sampling controller 13 may sample the peak value of the current with the first pulsating waveform based on the ADC. In some embodiments, the current sampling controller 13 may further include a control unit. The control unit may be, for example, a MCU (Microcontroller Unit). The control unit includes an ADC port, and the control unit may be coupled to the capacitor in the sampling and holding unit 12 via the ADC port. The control unit may sample the peak value of the current with the first pulsating waveform by sampling the voltage across both ends of the capacitor.

When the sampling and holding unit 12 is in the sampling state, the voltage across both ends of the capacitor increases with the current value of the current with the first pulsating waveform, which is equivalent to a charging process. When the sampling and holding unit 12 is in the holding state, the voltage across both ends of the capacitor reaches the maximum. A correspondence relationship between the voltage across both ends of the capacitor and the current value of the first pulsating waveform can be established in advance. In this way, the current sampling controller 13 can obtain the peak value of the current with the first pulsating waveform by sampling the voltage value across both ends of the capacitor.

Alternatively, in some embodiments, the current sampling controller 13 is further configured to control the sampling and holding unit 12 to switch to the sampling state from the holding state, after the peak value of the current with the first pulsating waveform is sampled.

In detail, the peak value of the current with the first pulsating waveform may vary in real time, and thus it is required to continuously detect the peak value of the current with the first pulsating waveform, so as to ensure the real-time performance and accuracy of the current information, and further ensure smooth proceeding of the whole charging process. Based on this, after sampling the peak value of the current with the first pulsating waveform, the current sampling controller 13 provided by embodiments of the present disclosure may control the sampling and holding unit 12 to enter into the sampling state, to re-sample the current with the first pulsating waveform, thus ensuring the real-time performance and accuracy of the sampled peak value of the current with the first pulsating waveform.

Further, in some embodiments, the current sampling controller 13 may complete one sampling of the peak value in each cycle of the first pulsating waveform, and control the sampling and holding unit 12 to switch to the sampling state from the holding state immediately after sampling the peak value. In this way, the peak value of the current with the first pulsating waveform sampled by the current sampling controller 13 is updated every cycle of the first pulsating waveform, thus ensuring the real-time performance and accuracy of the sampled peak value of the current with the first pulsating waveform.

From the above, it can be understood that, the output current of the second adapter 10, i.e., the charging current, is the current with the first pulsating waveform. The charging current may charge the battery intermittently, and a cycle of the charging current may vary with the gird frequency. In some embodiments, the frequency corresponding to the cycle of the charging current may be an integral multiple of the grid frequency, or may be 1/N of the grid frequency, where N is an integer greater than 1. In other words, the charging current may charge the battery intermittently. In some embodiments, the charging current may consist of one pulse or a set of pulses synchronous with the power grid.

It should be understood that, the current sampling controller 13 may control the sampling and holding unit 12 to switch to the sampling state from the holding state in many ways. For example, the current sampling controller 13 may control the capacitor in the sampling and holding unit 12 to discharge, to empty charges in the capacitor, such that when a next sampling cycle comes, the capacitor in the sampling and holding unit 12 may be charged again.

Figure 4:
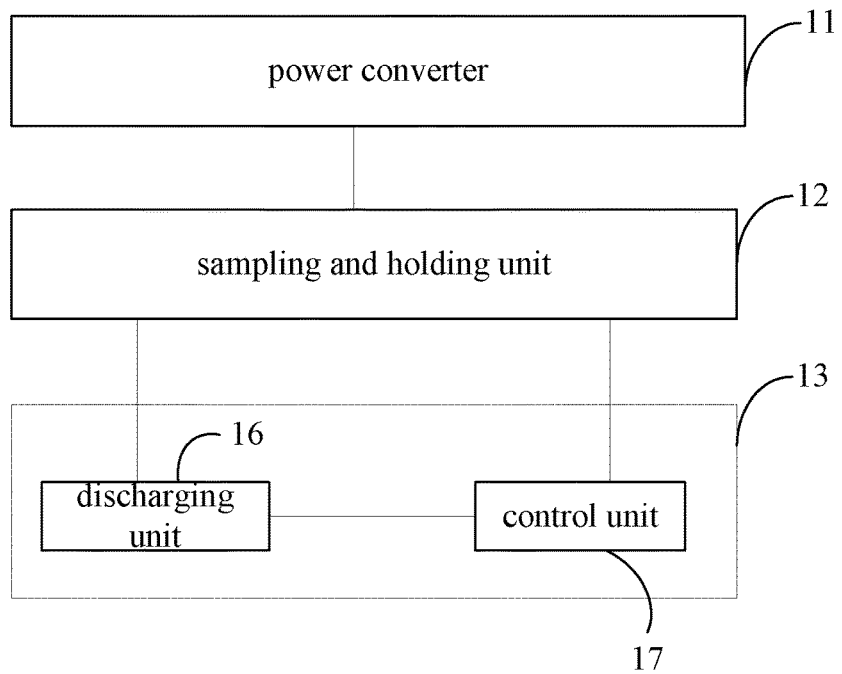
FIG. 4 is a block diagram of a second adapter according to yet another embodiment of the present disclosure.

Alternatively, in some embodiments, as illustrated in FIG. 4, the sampling and holding unit 12 may hold the peak value of the current with the first pulsating waveform based on the capacitor (not illustrated in FIG. 4) in the sampling and holding unit 12. The current sampling controller 13 may include a discharging unit 16 and a control unit 17. The discharging unit 16 is coupled to the control unit 17 and the capacitor in the sampling and holding unit 12 respectively. The discharging unit 16 is configured to release charges in the capacitor of the sampling and holding unit 12 under a control of the control unit 17, such that the sampling and holding unit 12 switches to the sampling state from the holding state. Further, the peak value of the current with the first pulsating waveform held by the sampling and holding unit 12 may be sampled by the control unit 17.

The discharging unit 16 may be implemented in many ways. For example, the discharging unit 16 may include a switch and a resistor coupled in series with the capacitor in the sampling and holding unit 12. When it needs to discharge, the control unit 17 controls the switch to switch on, such that the capacitor discharges to the resistor, thus releasing the charges in the capacitor.

In embodiments of the present disclosure, the way in which the current sampling controller 13 determines whether the sampling and holding unit 12 is in the holding state is not limited, which will be described in detail below with reference to specific embodiments.

Alternatively, in some embodiments, the current sampling controller 13 may detect the current value sampled by the sampling and holding unit 12 in real time, and when the current values detected twice in a row keep unchanged, it indicates that the sampling and holding unit 12 is in the holding state.

Alternatively, in some embodiments, the current sampling controller 13 is configured to receive a synchronous signal, and to determine whether the sampling and holding unit 12 is in the holding state based on the synchronous signal. A cycle of the synchronous signal is 1/N of the cycle of the first pulsating waveform, where N is an integer greater than or equal to 1.

Since the current with the first pulsating waveform varies periodically, the time interval between the sampling state and the holding state of the sampling and holding unit 12 is related to the cycle of the current with the first pulsating waveform (this time interval may be ½ of the cycle of the current with the first pulsating waveform). Based on this, in embodiments of the present disclosure, the synchronous signal having a special relationship with the cycle of the first pulsating waveform is introduced (i.e., the cycle of the synchronous signal is 1/N of the cycle of the first pulsating waveform), and the working state of the sampling and holding unit 12 is determined based on the synchronous signal. For example, the cycle relationship and/or phase relationship of the synchronous signal and the first pulsating waveform may be used to determine whether the first pulsating waveform is at the peak value or in the falling edge. When the first pulsating waveform is at the peak value or in the falling edge, it is determined that the sampling and holding unit 12 is in the holding state. In the present disclosure, determining whether the first pulsating waveform is at the peak value or in the falling edge refers to determining whether the first pulsating waveform is at the peak value of the first pulsating waveform or in the falling edge of the first pulsating waveform. Alternatively, determining whether the first pulsating waveform is at the peak value or in the falling edge refers to determining whether the present output current of the second adapter is at the peak value of the first pulsating waveform or in the falling edge of the first pulsating waveform, or determining whether the present output current of the second adapter is the current corresponding to the peak value or the falling edge of the first pulsating waveform.

Alternatively, as an implementation, the cycle of the first pulsating waveform is the same as the cycle of the synchronous signal. Further, in some embodiments, the first pulsating waveform may be in phase with the synchronous signal. In other words, when the synchronous signal is in the rising edge, the first pulsating waveform is in the rising edge, and when the synchronous signal is at the peak value or in the falling edge, the first pulsating waveform is at the peak value or in the falling edge. Since the sampling and holding unit is in the holding state when the first pulsating waveform is at the peak value or in the falling edge, it is possible to determine the time when the sampling and the holding unit 12 is in the holding state as long as the time when the synchronous signal is at the peak value or in the falling edge is determined. In other embodiments, there may be a fixed difference between the phase of the first pulsating waveform and the phase of the synchronous signal, for example, the phase difference may be 90 degree, or 180 degree. In this case, it is also possible to determine when the first pulsating waveform is at the peak value or in the falling edge and to further determine when the sampling and holding unit 12 is in the holding state, based on the cycle relationship and phase relationship between the first pulsating waveform and the synchronous signal.

Figure 5:
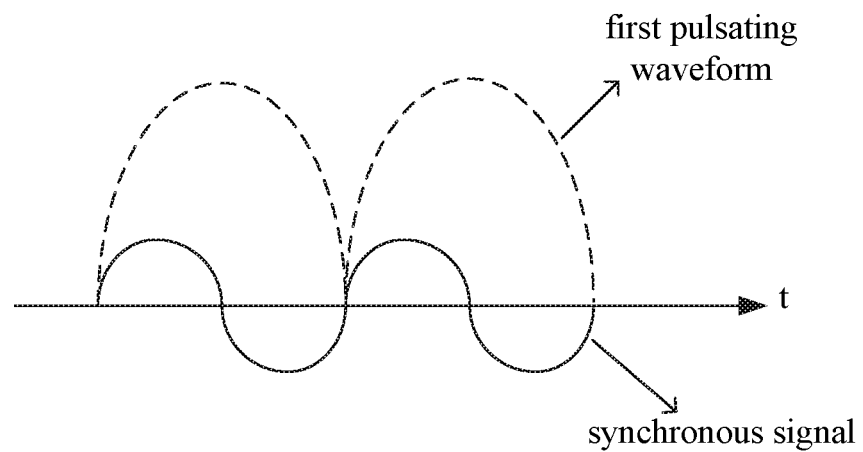
FIG. 5 is a schematic diagram illustrating a phase relationship between a synchronous signal and a first pulsating waveform according to an embodiment of the present disclosure.

When the cycle of the synchronous signal is ½, ⅓, ¼ and the like of the cycle of the first pulsating waveform, it is also possible to determine the working state of the sampling and holding unit 12 based on the phase relationship and cycle relationship of the synchronous signal and the first pulsating waveform. As illustrated in FIG. 5, the waveform of the synchronous signal is presented by solid line, and the first pulsating waveform is presented by dotted line. The cycle of the synchronous signal is ½ of the cycle of the first pulsating waveform, and thus when the synchronous signal is in the negative half-cycle, the first pulsating waveform is at the peak value or in the falling edge, and the sampling and holding unit 12 is in the holding state. Thus, it is possible to determine when the first pulsating waveform is at the peak value or in the falling edge by only determining when the waveform of the synchronous signal is in the negative half-cycle. And similarly for the others, which will not be elaborated here.

Furthermore, the synchronous signal may be with the pulsating waveform, or with the triangular waveform, or may be of other types, which is not limited in embodiments of the present disclosure.

In embodiments of the present disclosure, the way for obtaining the synchronous signal is not limited, which will be described in detail below with reference to specific embodiments.

Alternatively, in some embodiments, the current sampling controller 13 is coupled to the power converter 11, and configured to obtain the synchronous signal from the power converter 11.

It should be understood that, the synchronous signal obtained from the power converter 11 may be the alternating current signal received by the power converter 11, the voltage/current signal obtained by the power converter 11 after primary rectification, or the voltage/current signal coupled to the secondary side from the primary side of the power converter 11, or the voltage/current signal obtained after secondary rectification, or the like, which is not limited in embodiments of the present disclosure.

Figure 6:
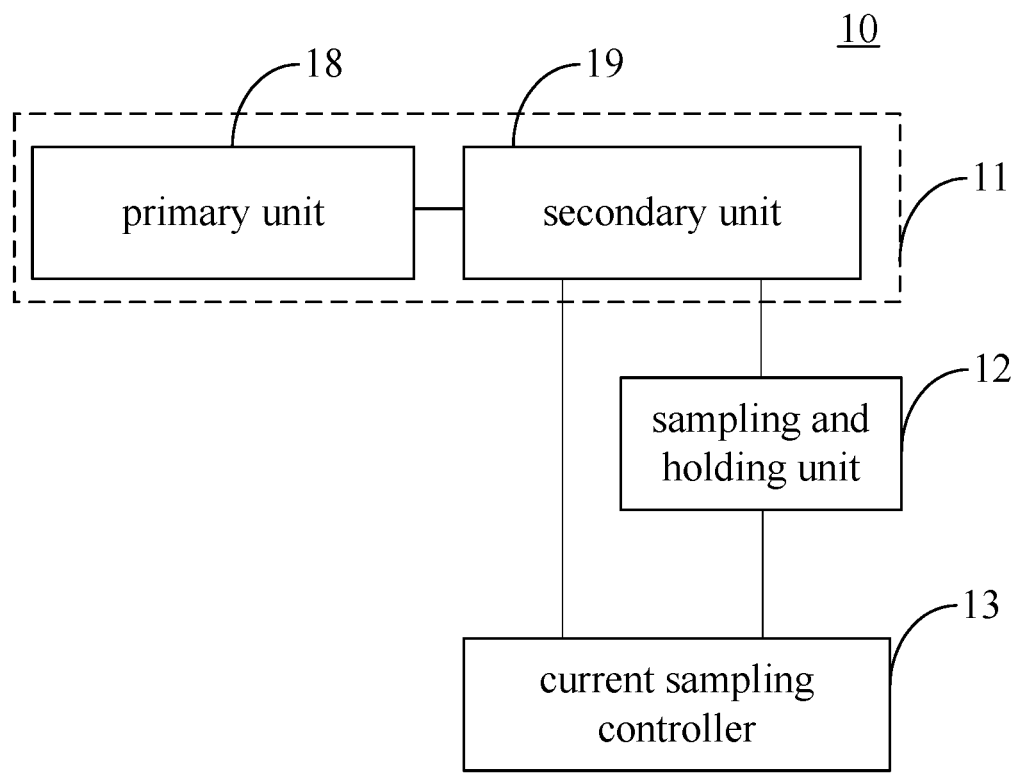
FIG. 6 is a block diagram of a second adapter according to still yet another embodiment of the present disclosure.

Alternatively, in some embodiments, as illustrated in FIG. 6, the power converter 11 may include a primary unit 18 and a secondary unit 19. The current sampling controller 13 is coupled to the secondary unit 19, and configured to obtain the synchronous signal from the secondary unit 19.

Figure 7:
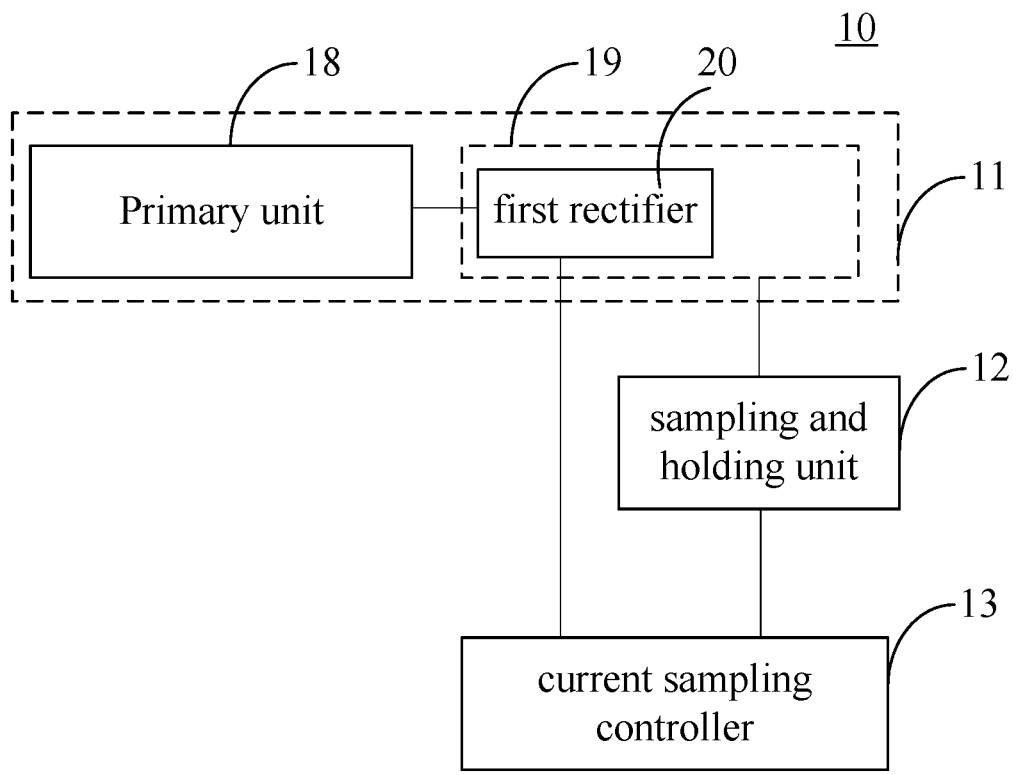
FIG. 7 is a block diagram of a second adapter according to still yet another embodiment of the present disclosure.

It should be understood that, there may be many ways for obtaining the synchronous signal from the secondary unit 19. For example, the synchronous signal may be obtained directly from the bus (VBUS) of the secondary unit 19. In detail, since the output current of the second adapter 10 is the current with the first pulsating waveform, and the output end of the second adapter 10 is coupled with the bus of the secondary unit 19, it should have the current with the first pulsating waveform on the bus of the secondary unit 19, and the synchronous signal can be obtained directly from the bus of the secondary unit 19. For another example, as illustrated in FIG. 7, the secondary unit 19 may include a first rectifier 20. The first rectifier 20 is coupled to the current sampling controller 13. The first rectifier 20 is configured to rectify the current coupled to the secondary unit 19 from the primary unit 18, to obtain a voltage with a second pulsating waveform, and to send the voltage with the second pulsating waveform to the current sampling controller 13 as the synchronous signal.

The secondary unit 19 itself includes a secondary rectifier. The secondary rectifier and the first rectifier 20 may be two separate rectifiers. The secondary rectifier is configured to rectify the current coupled to the secondary side from the primary side, to obtain the output current of the second adapter. The first rectifier is configured to rectify the current coupled to the secondary side from the primary side, to obtain the synchronous signal.

Figure 21:
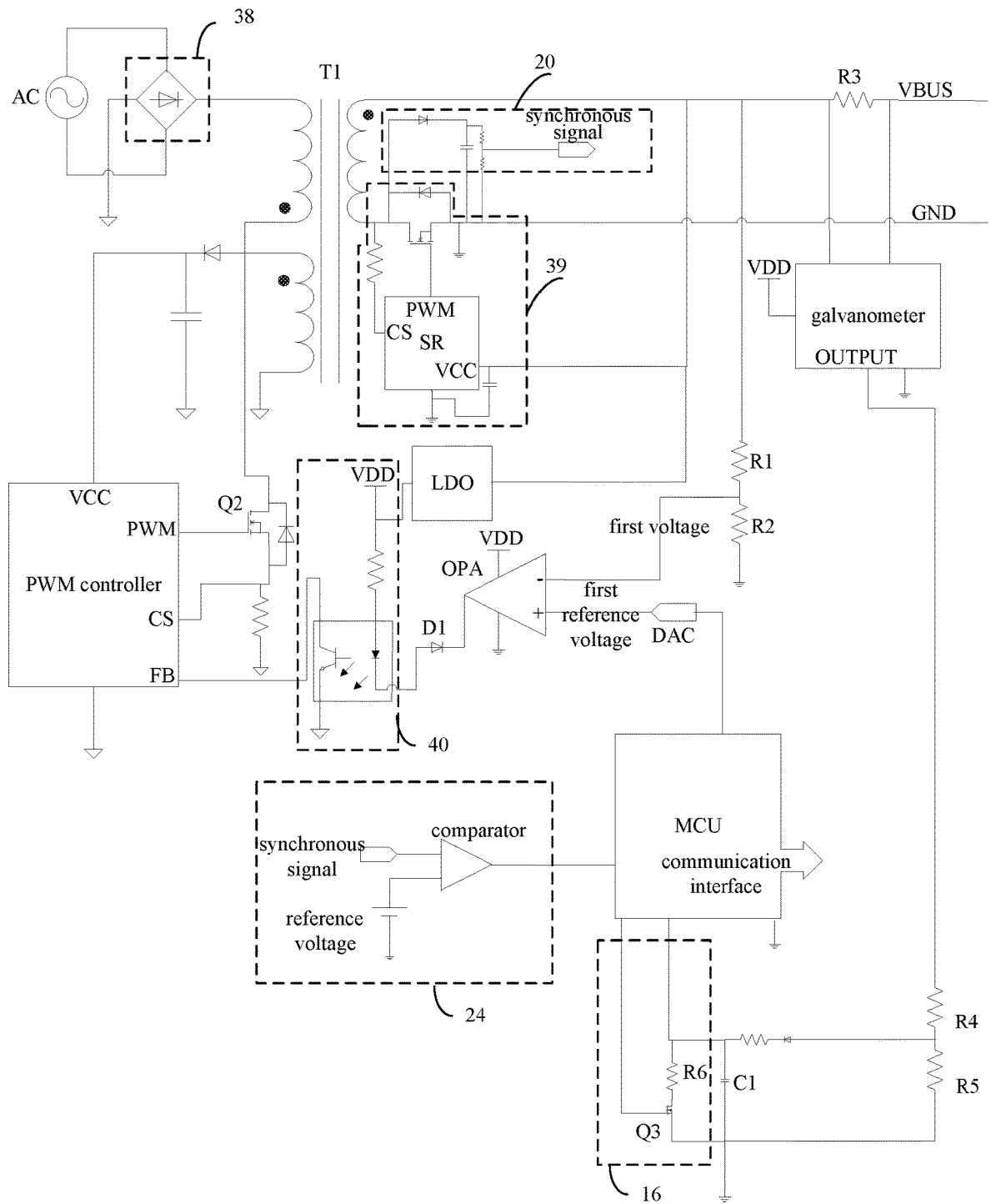
FIG. 21 is a schematic diagram illustrating a circuit of a second adapter according to an embodiment of the present disclosure.

As illustrated in FIG. 21, the unit indicated by the reference number 39 is the secondary rectifier. Both the secondary rectifier 39 and the first rectifier 20 may be located close to the secondary winding side of the transformer T1, so as to rectify the current coupled to the secondary side from the primary side.

Figure 8:
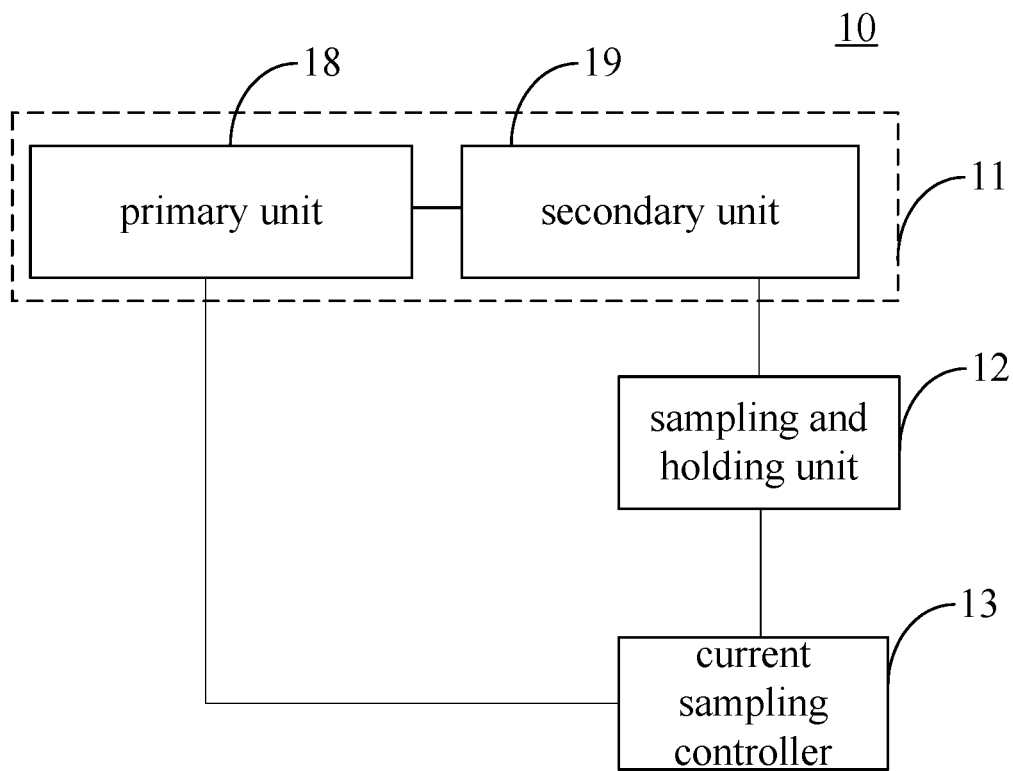
FIG. 8 is a block diagram of a second adapter according to still yet another embodiment of the present disclosure.

Alternatively, in some embodiments, as illustrated in FIG. 8, the power converter 11 may include a primary unit 18 and a secondary unit 19. The current sampling controller 13 is coupled to the primary unit 18, and configured to obtain the synchronous signal from the primary unit 18.

It should be understood that, there may be many ways for obtaining the synchronous signal from the primary unit 18. For example, it is possible to obtain the alternating current signal directly from the primary unit 18 and send the alternating current signal to the current sampling controller 13 as the synchronous signal. For another example, the pulsating direct current signal obtained after rectification of the rectifier circuit in the primary unit 18 may be sent to the current sampling controller 13 as the synchronous signal.

Figure 9:
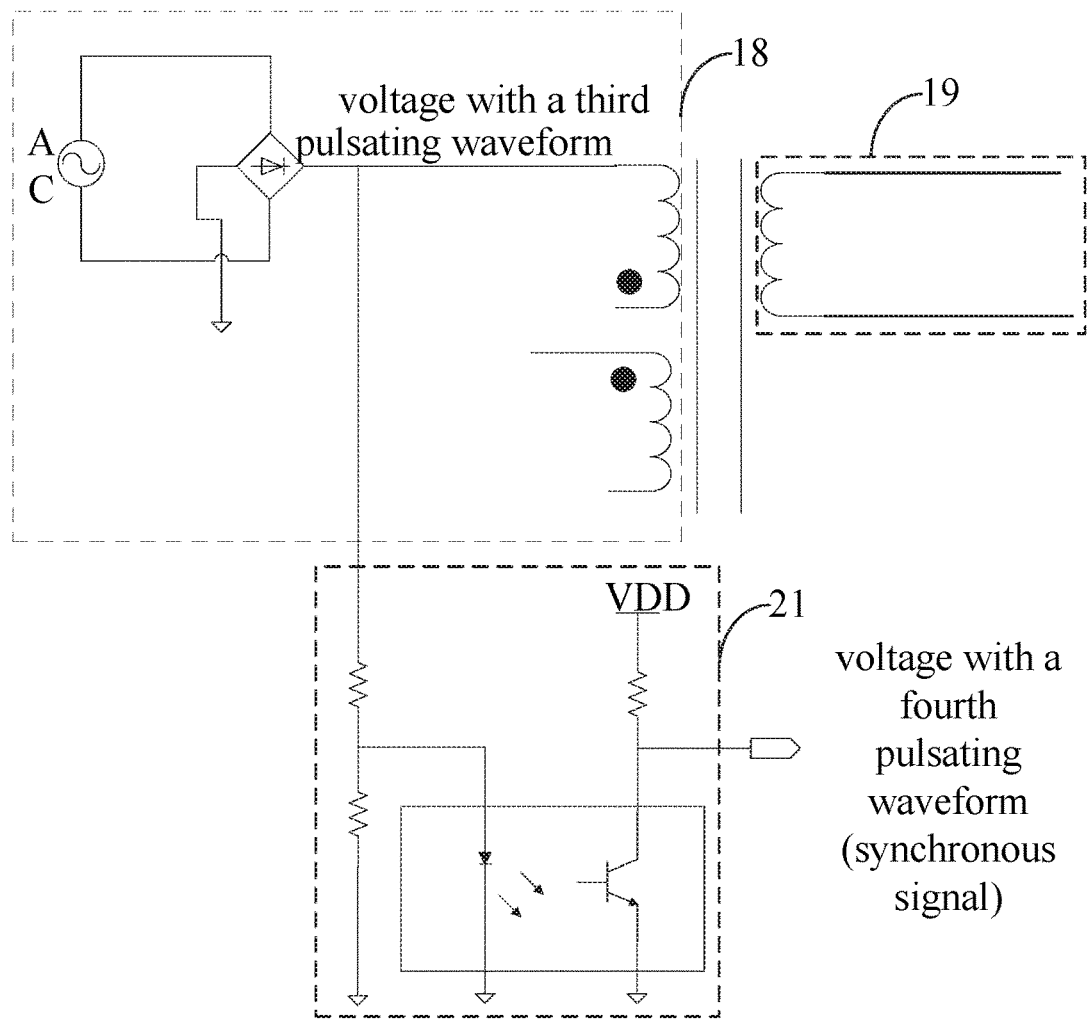
FIG. 9 is a schematic diagram illustrating a method of obtaining a synchronous signal according to an embodiment of the present disclosure.

In detail, as illustrated in FIG. 9, the primary unit 18 rectifies the alternating current AC to obtain a voltage with the third pulsating waveform. The cycle of the third pulsating waveform is the same as the cycle of the first pulsating waveform. The primary unit 18 may couple the voltage with the third pulsating waveform to the secondary side from the primary side of the second adapter 10 via an optical coupling unit 21 to obtain a voltage with a fourth pulsating waveform, and send the voltage with the fourth pulsating waveform to the current sampling controller 13 as the synchronous signal. The optical coupling unit 21 may play a function of isolating interference between the primary side and the secondary side. As an alternative way, the primary unit 18 may directly send the voltage with the third pulsating waveform to the current sampling controller 13 without passing through the optical coupling unit 21, which is not limited in embodiments of the present disclosure.

In the above, the way for obtaining the synchronous signal from the power converter 11 is described in detail with reference to specific embodiments. However, the way for obtaining the synchronous signal is not limited to this, and other ways for obtaining the synchronous signal are illustrated in the following.

Alternatively, in some embodiments, the current sampling controller 13 may obtain the synchronous signal from the sampling and holding unit 12.

In detail, the sampling and holding unit 12 may sample the output current of the second adapter, i.e., the current with the first pulsating waveform, to obtain the sampling current. The sampling current obtained by the sampling and holding unit 12, or signals such as the sampling voltage corresponding to the sampling current have a same cycle and phase as the current with the first pulsating waveform. Using the sampling current or sampling voltage as the synchronous signal may simplify the logic of determining the working state of the sampling and holding unit 12.

In general, the sampling and holding unit 12 will sample the current with the first pulsating waveform to obtain the sampling current, and convert the sampling current into the sampling voltage. The sampling voltage may be used to indicate the magnitude of the current with the first pulsating waveform. The sampling and holding unit 12 may send the sampling voltage to the current sampling controller 13 as the synchronous signal. For example, as illustrated in FIG. 21, the voltage signal outputted from the output port (OUTPUT) of the galvanometer may be used as the synchronous signal.

In the above, the way for obtaining the synchronous signal has been described in detail. In the following, the way for determining whether the first pulsating waveform is at the peak value or in the falling edge based on the synchronous signal will be described in detail with reference to specific embodiments.

Alternatively, in some embodiments, the current sampling controller 13 determines whether the first pulsating waveform is at the peak value or in the falling edge based on the synchronous signal, and samples the peak value of the current with the first pulsating waveform held by the sampling and holding unit 12 when determining that the first pulsating waveform is at the peak value or in the falling edge.

In detail, the sampling and holding unit 12 may switch between the sampling state and the holding state based on charging and discharging of the capacitor. When the first pulsating waveform is in the rising edge, the capacitor in the sampling and holding unit 12 is in the charging state, the voltage across both ends of the capacitor increases with the current with the first pulsating waveform, and at this time, the sampling and holding unit 12 is in the sampling state. When the first pulsating waveform is at the peak value or in the falling edge, the voltage across both ends of the capacitor does not increase anymore, and at this time, the sampling and holding unit 12 is in the holding state. Thus, by determining when the first pulsating waveform is at the peak value or in the falling edge, when the sampling and holding unit 12 is in the holding state can be determined. Since there is a fixed relationship between the phase and cycle of the synchronous signal and the phase and cycle of the first pulsating waveform, whether the first pulsating waveform is at the peak value or in the falling edge can be determined based on the phase and/or cycle of the synchronous signal.

For example, the synchronous signal is in phase with the first pulsating waveform, and when the synchronous signal is at the peak value or in the falling edge, the first pulsating waveform is at the peak value or in the falling edge. For another example, the cycle of the synchronous signal is the same as the cycle of the first pulsating waveform, and the phase difference between the synchronous signal and the first pulsating waveform is a half cycle, and when the synchronous signal is in the rising edge, the first pulsating waveform is at the peak value or in the falling edge.

There may be many ways for detecting the phase of the synchronous signal. For example, the current or voltage of the synchronous signal may be detected in real time by an amperemeter or a voltmeter, such that the phase of the synchronous signal is determined, and further whether the first pulsating waveform is at the peak value or in the falling edge is determined. However, this way needs an additional current and voltage detecting circuit, which is complicated to implement. In the following, two implementations based on a comparator are described, which may compare the voltage of the synchronous signal with a reference voltage, so as to conveniently determine whether the first pulsating waveform is at the peak value or in the falling edge.

Figure 10:
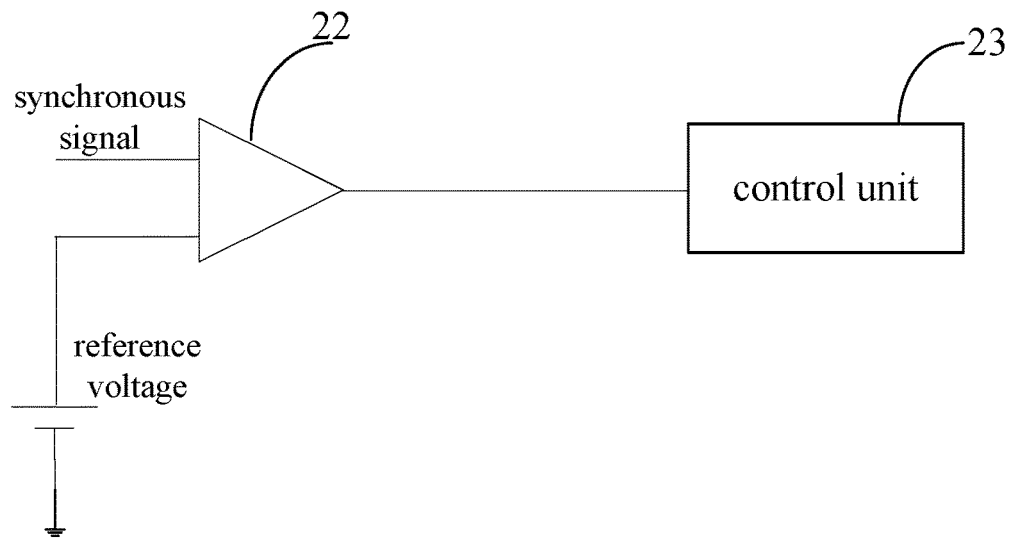
FIG. 10 is a schematic diagram illustrating a current sampling controller according to an embodiment of the present disclosure.

Alternatively, in some embodiments, as illustrated in FIG. 10, the current sampling controller 13 may include a comparator 22 and a control unit 23. A first input end of the comparator 22 is configured to receive the synchronous signal, and a second input end of the comparator 22 is configured to receive a reference voltage. The control unit 23 is coupled to an output end of the comparator 22, and configured to determine whether the first pulsating waveform is at the peak value or in the falling edge based on a comparison result between the voltage of the synchronous signal and the reference voltage. In some embodiments, the first input end is a non-inverting input end of the comparator, and the second input end is an inverting input end of the comparator. In other embodiments, the first input end is the inverting input end of the comparator, and the second input end is the non-inverting input end of the comparator.

It should be understood that, in embodiments of the present disclosure, the way for selecting the voltage value of the reference voltage is not limited. Taking the synchronous signal being a pulsating signal at zero crossing point as an example, the voltage value of the reference voltage may be selected as a certain value greater than zero and less than the peak value of the synchronous signal. Taking the synchronous signal being the alternating current signal as an example, the voltage value of the reference voltage may be selected as zero.

Figure 11:
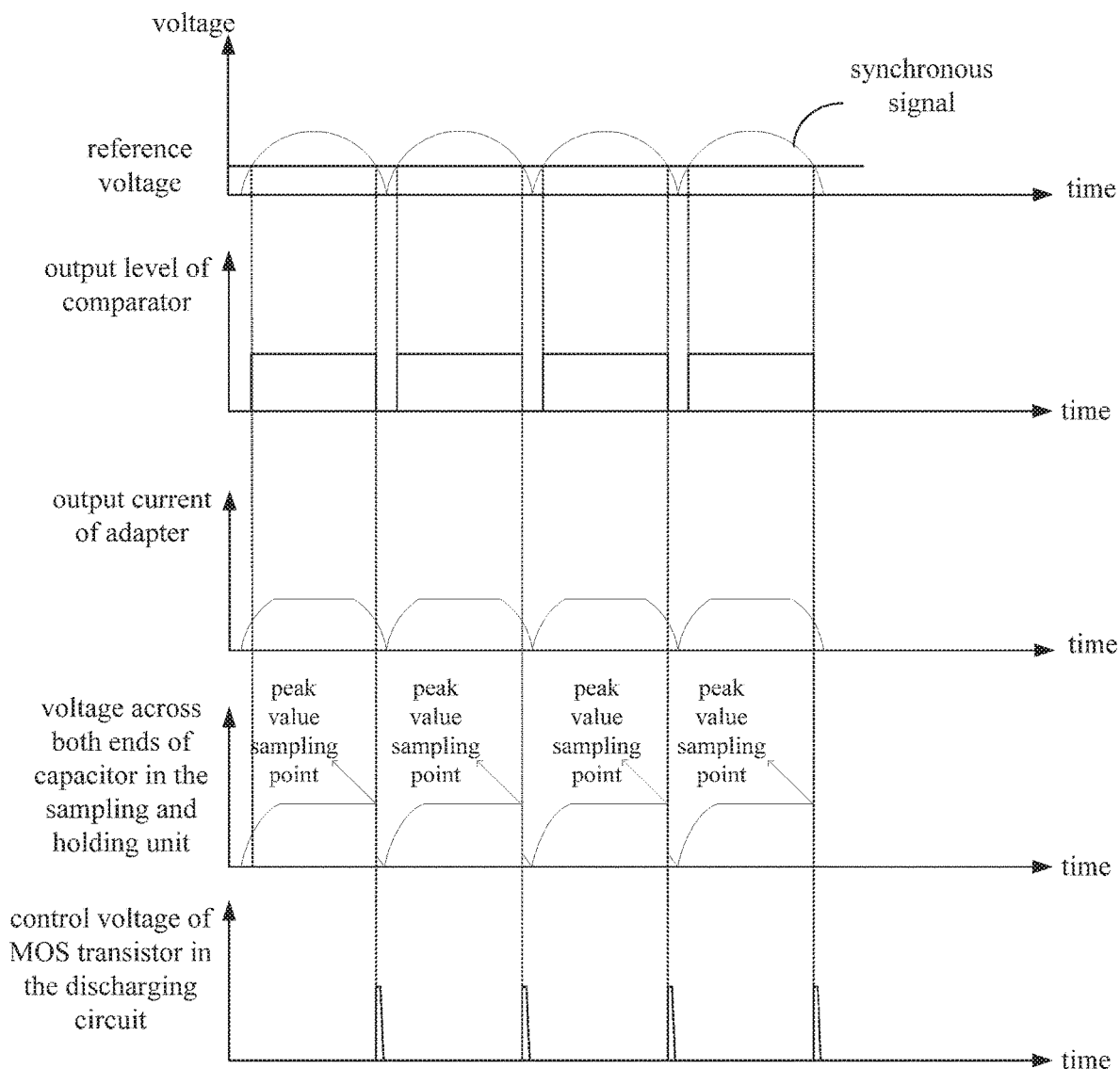
FIG. 11 is a schematic diagram illustrating waveforms of a reference voltage, an output level of a comparator, and an output current of a second adapter according to an embodiment of the present disclosure.
Figure 12:
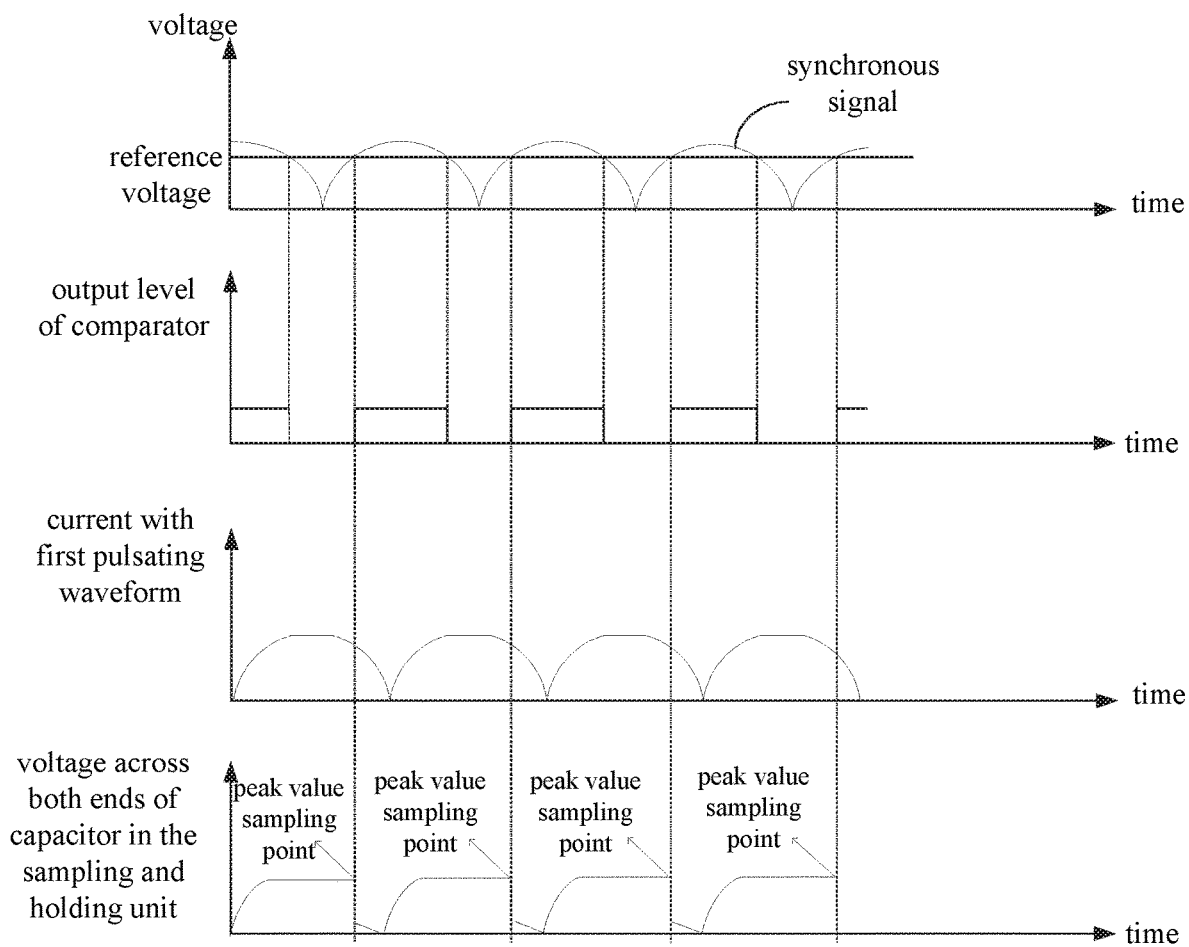
FIG. 12 is a schematic diagram illustrating waveforms of a reference voltage, an output level of a comparator, and an output current of a second adapter according to another embodiment of the present disclosure.

Moreover, in embodiments of the present disclosure, the way for determining whether the first pulsating waveform is at the peak value or in the falling edge based on the comparison result between the voltage of the synchronous signal and the reference voltage is not limited. This determining is related to the cycle and phase of the synchronous signal and the cycle and phase of the first pulsating waveform. In the following, with reference to FIG. 11 and FIG. 12, and taking the cycle of the synchronous signal being the same as the cycle of the first pulsating waveform as an example, the way for determining the peak value or falling edge of the first pulsating waveform is illustrated. In embodiments of FIG. 11 and FIG. 12, the current sampling controller 13 samples the peak value of the current with the first pulsating waveform held by the sampling and holding unit in each cycle of the first pulsating waveform. After the sampling is completed, the current sampling controller 13 immediately provides the control voltage to a MOS transistor in the discharging unit, controls the MOS transistor in the discharging unit to switch on, and releases the charges in the capacitor of the sampling and holding unit 12. However, FIG. 11 and FIG. 12 are merely examples, and the present disclosure is not limited thereto. For example, the current sampling controller 13 may sample the peak value of the current with the first pulsating waveform once every multiple cycles. In addition, the discharging unit may be implemented in ways other than using the MOS transistor, for example, the discharging unit may be controlled to switch on and off by using other types of switches.

In the embodiment of FIG. 11, the synchronous signal is in phase with the first pulsating waveform (the pulsating waveform after the peak clipping process). It can be seen from FIG. 11 that, since the synchronous signal is in phase with the first pulsating waveform, the first pulsating waveform is at the peak value or in the falling edge when the synchronous signal is at the peak value or in the falling edge. Thus, as long as when the synchronous signal is at the peak value or in the falling edge is determined, when the first pulsating waveform is at the peak value or in the falling edge can be obtained.

Further, in order to determine when the synchronous signal is at the peak value or in the falling edge, a comparator is introduced in the embodiment of FIG. 11. The comparator obtains a changing curve of an output level of itself (i.e., the rectangular wave as illustrated in FIG. 11) by comparing the voltage values of the synchronous signal and the reference voltage. It can be seen from the rectangular wave that, at the moment when the output level of the comparator switches to the low level from the high level (hereinafter, referred to as the target moment), the first pulsating waveform is in the falling edge. At this moment, the capacitor in the sampling and holding unit 12 is in the holding state. Thus, in embodiments of the present disclosure, the target moment is used as the peak value sampling point, the current sampling controller 13 is controlled to sample the voltage across both ends of the capacitor in the sampling and holding unit 12, and further the peak value of the current with the first pulsating waveform is obtained. After the peak value of the current with the first pulsating waveform is sampled, the MOS transistor in the discharging unit is immediately controlled to switch on, such that the charge in the capacitor of the sampling and holding unit 12 is released, and the sampling in a next cycle is prepared.

In the embodiment of FIG. 12, the phase difference between the synchronous signal and the first pulsating waveform is 180 degree, and the first pulsating waveform is subjected to the peak clipping process. It can be seen from FIG. 12 that, since the phase difference between the synchronous signal and the first pulsating waveform is 180 degree, the first pulsating waveform is at the peak value or in the falling edge when the synchronous signal is at the peak value or in the rising edge. Thus, as long as when the synchronous signal is at the peak value or in the rising edge is determined, when the first pulsating waveform is at the peak value or in the falling edge can be obtained.

Further, in order to determine when the synchronous signal is at the peak value or in the rising edge, a comparator is introduced into the embodiment of FIG. 12. The comparator obtains a changing curve of an output level of itself (i.e., the rectangular wave as illustrated in FIG. 12) by comparing the voltage values of the synchronous signal and the reference voltage. It can be seen from the rectangular wave that, at the moment when the output level of the comparator switches to the high level from the low level (hereinafter, referred to as the target moment), the first pulsating waveform is in the falling edge. At this moment, the capacitor in the sampling and holding unit 12 is in the holding state. Thus, in embodiments of the present disclosure, the target moment is used as the peak value sampling point, the current sampling controller 13 is controlled to sample the voltage across both ends of the capacitor in the sampling and holding unit 12, and further the peak value of the current with the first pulsating waveform is obtained. After the peak value of the current with the first pulsating waveform is sampled, the MOS transistor in the discharging unit is immediately controlled to switch on, such that the charge in the capacitor of the sampling and holding unit 12 is released, and the sampling in a next cycle is prepared.

Figure 13:
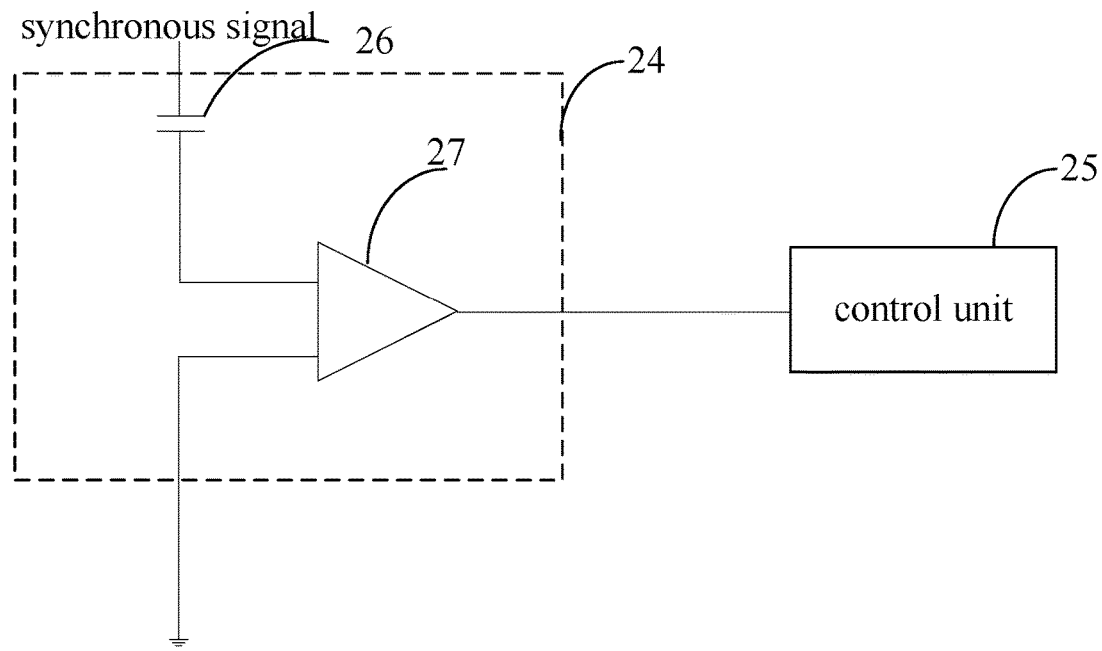
FIG. 13 is a schematic diagram illustrating a current sampling controller according to another embodiment of the present disclosure.

Alternatively, in other embodiments, as illustrated in FIG. 13, the current sampling controller 13 may include a comparing unit 24 and a control unit 25. The comparing unit 24 may include a capacitor 26 and a comparator 27. The capacitor 26 is configured to receive the synchronous signal, and to filter out a direct current signal in the synchronous signal to obtain an alternating current signal at zero crossing point. A first input end of the comparator 27 is coupled to the capacitor 26, and is configured to receive the alternating current signal. A second input end of the comparator 27 is configured to receive the reference voltage. The comparator 27 is configured to compare the voltage of the alternating current signal with the reference voltage. The control unit 25 is coupled to an output end of the comparator 27, and is configured to determine whether the first pulsating waveform is at the peak value or in the falling edge based on the comparison result between the voltage of the alternating current signal and the reference voltage. Further, in embodiments of the present disclosure, the voltage value of the reference voltage can be set to zero. In some embodiments, the first input end is a non-inverting input end of the comparator, and the second input end is an inverting input end of the comparator. In other embodiments, the first input end is the inverting input end of the comparator, and the second input end is the non-inverting input end of the comparator.

Taking the synchronous signal being a signal with a pulsating waveform as an example, the signal with the pulsating waveform can be regarded as being formed of a direct current signal (direct current component) and an alternating current signal at zero crossing point (alternating current component). The capacitor 26 can filter out the direct current signal in the signal with the pulsating waveform, and the alternating current signal at zero crossing point remains. In this implementation, by setting the reference voltage of the comparator 27 to zero (for example, the second input end of the comparator is grounded), the phase of the synchronous signal can be determined easily.

Further, in embodiments of the present disclosure, there are many ways for determining whether the first pulsating waveform is at the peak value or in the falling edge based on the alternating current signal and the reference voltage, which are related to the cycle and phase of the alternating current signal and the cycle and phase of the first pulsating waveform. Detailed determining is similar to that described with reference to FIG. 11 and FIG. 12, and will not be elaborated here.

In the above, the way for obtaining the peak value of the current with the first pulsating waveform has been described in detail. In the following, the way for controlling the charging process based on the obtained peak value of the current with the first pulsating waveform will be described in detail with reference to specific embodiments.

Figure 14:
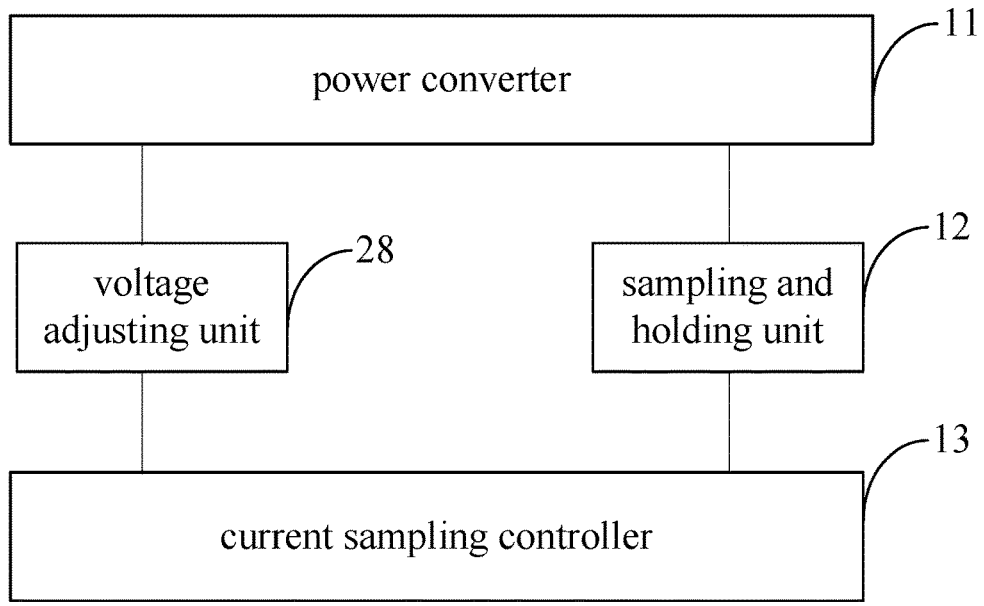
FIG. 14 is a block diagram of a second adapter according to still yet another embodiment of the present disclosure.

Alternatively, in some embodiments, as illustrated in FIG. 14, the second adapter 10 may further include a voltage adjusting unit 28. The voltage adjusting unit 28 is coupled to the power converter 11, and is configured to detect and adjust the output voltage of the second adapter 10. The current sampling controller 13 is coupled to the voltage adjusting unit 28. The peak value of the current with the first pulsating waveform is adjusted by the voltage adjusting unit 28.

It should be understood that, the basic function of the voltage adjusting unit 28 is to adjust the output voltage of the second adapter. In detail, the voltage adjusting unit 28 may detect the output voltage of the second adapter 10 via the power converter 11, and adjust the output voltage of the second adapter 10 via the power converter 11. In other words, the voltage adjusting unit 28 and the power converter 11 form a feedback control system of the output voltage of the second adapter, in which the feedback control system may be referred to as a voltage feedback loop. It should be understood that, when the output power of the second adapter is fixed, adjusting the voltage will cause changing of the current. Thus, in embodiments of the present disclosure, after sampling the peak value of the current with the first pulsating waveform, the current sampling controller 13 may utilize the above voltage feedback loop to realize adjusting the current. For example, after the current sampling controller 13 samples the peak value of the current with the first pulsating waveform, if the current sampling controller 13 wishes to adjust the sampled peak value of the current with the first pulsating waveform to a target peak value, the current sampling controller 13 may calculate a target value of the output voltage of the second adapter 10 corresponding to the target peak value via software, and then adjust the output voltage of the second adapter 10 to the target value by using the voltage feedback loop.

In embodiments of the present disclosure, the current sampling controller 13 and the voltage feedback loop form the feedback control system for the peak value of the output current of the second adapter 10. The feedback control system is also referred to as the current feedback loop. In other words, in embodiments of the present disclosure, it does not only include the voltage feedback loop (implemented by hardware), but also include the current feedback loop (based on the voltage feedback loop, and implemented by software calculation), such that the second adapter cannot only realize controlling the output voltage of the second adapter, but can also realize controlling the output current of the second adapter, which riches the functions of the second adapter, and improves the intelligence degree of the second adapter.

There may be many ways for the current sampling controller 13 to adjust the peak value of the current with the first pulsating waveform via the voltage adjusting unit 28. In the following, examples are illustrated with reference to FIG. 15 and FIG. 17.

Figure 15:
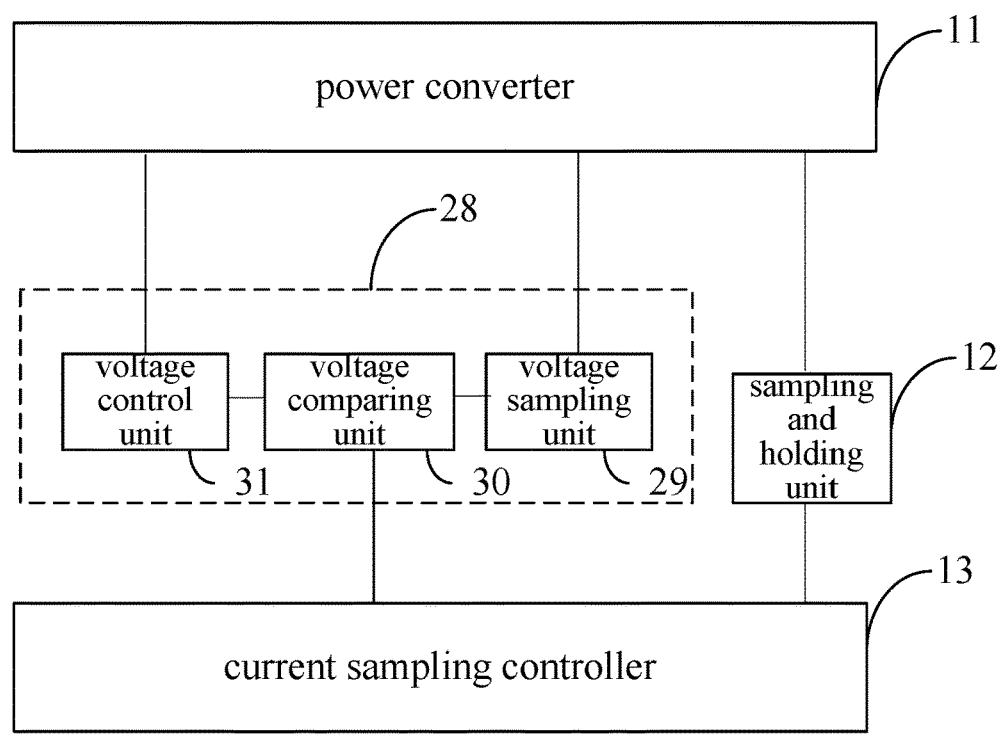
FIG. 15 is a block diagram of a second adapter according to still yet another embodiment of the present disclosure.

Alternatively, in some embodiments, as illustrated in FIG. 15, the voltage adjusting unit 28 may include a voltage sampling unit 29, a voltage comparing unit 30 and a voltage control unit 31. The voltage sampling unit 29 is coupled to the power converter 11, and is configured to sample the output voltage of the second adapter 10 to obtain a first voltage. An input end of the voltage comparing unit 30 is coupled to the voltage sampling unit 29, and the 30 voltage comparing unit 30 is configured to compare the first voltage with a first reference voltage. An input end of the voltage control unit 31 is coupled to an output end of the voltage comparing unit 30. An output end of the voltage control unit 31 is coupled to the power converter 11. The voltage control unit 31 controls the output voltage of the second adapter 10 according to the comparison result of the first voltage and the first reference voltage. The current sampling controller 13 is coupled to the voltage comparing unit 30, and is configured to adjust the peak value of the current with the first pulsating waveform by adjusting the voltage value of the first reference voltage.

In detail, the input end of the voltage sampling unit 29 may be coupled to the bus (VBUS) of the second adapter, for sampling the output voltage of the second adapter. In some embodiments, the voltage sampling unit 29 may be a wire. In this way, the first voltage sampled by the voltage sampling unit 29 is the output voltage of the second adapter. In other embodiments, the voltage sampling unit 29 may include two resistors configured for voltage division. In this way, the first voltage sampled by the voltage sampling unit 29 is the voltage obtained after voltage division by the two resistors. The voltage comparing unit 30 is implemented by an operational amplifier. One input end of the operational amplifier is configured to receive the first voltage inputted by the voltage sampling unit 29, and the other input end of the operational amplifier is configured to receive the first reference voltage. An output end of the operational amplifier is configured to generate a voltage feedback signal, for indicating whether the first voltage is equal to the first reference voltage. The voltage control unit 31 may be implemented based on elements such as an optical coupling element and a PWM controller, and may adjust the output voltage of the second adapter based on the voltage feedback signal provided by the voltage comparing unit 30. When the output power of the second adapter is fixed, the current sampling controller 13 may calculate the expected value of the output voltage of the second adapter based on the expected peak value of the current with the first pulsating waveform. Then, by adjusting the voltage value of the first reference voltage, the output voltage of the second adapter is adjusted to the expected value of the output voltage of the second adapter, such that the peak value of the current with the first pulsating waveform is adjusted to the expected peak value.

Figure 16:
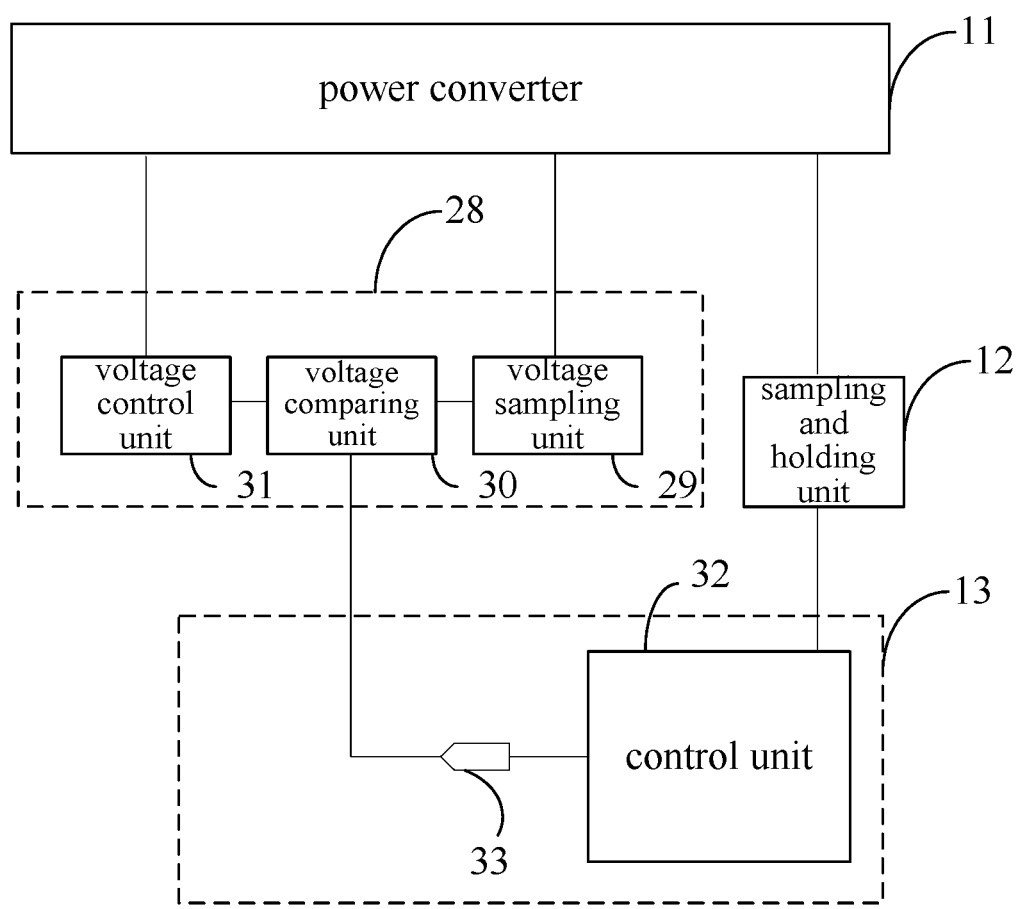
FIG. 16 is a block diagram of a second adapter according to still yet another embodiment of the present disclosure.

There may be many ways for the current sampling controller 13 to adjust the voltage value of the first reference voltage. Alternatively, in an embodiment, as illustrated in FIG. 16, the current sampling controller 13 may include a control unit 32 and a DAC (Digital-to-Analog Converter) 33. An input end of the DAC 33 is coupled to the control unit 32, and an output end of the DAC 33 is coupled to the voltage comparing unit 30. The control unit 32 adjusts the voltage value of the first reference voltage via the DAC 33, so as to adjust the peak value of the current with the first pulsating waveform. Alternatively, in another embodiment, the control unit 32 may adjust the voltage value of the first reference voltage via circuits such as an RC unit and a digital potentiometer, which is not limited in embodiments of the present disclosure.

Figure 17:
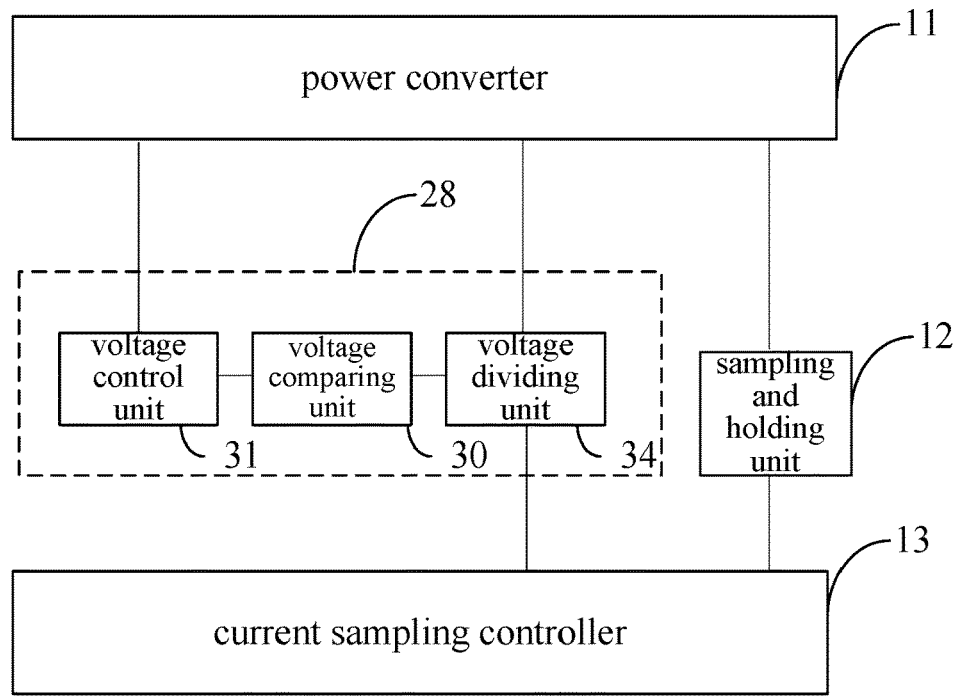
FIG. 17 is a block diagram of a second adapter according to still yet another embodiment of the present disclosure.

Alternatively, in some embodiments, as illustrated in FIG. 17, the voltage adjusting unit 28 may include a voltage dividing unit 34, a voltage comparing unit 30 and a voltage control unit 31. An input end of the voltage dividing unit 34 is coupled to the power converter 11. The voltage dividing unit 34 is configured to perform voltage division on the output voltage of the second adapter 10 based on a preset voltage division ratio to obtain a second voltage. An input end of the voltage comparing unit 30 is coupled to an output end of the voltage dividing unit 34. The voltage comparing unit 30 is configured to compare the second voltage with a second reference voltage. An input end of the voltage control unit 31 is coupled to the input end of the voltage comparing unit 30. An output end of the voltage control unit 31 is coupled to the power converter 11. The voltage control unit 31 controls the output voltage of the second adapter 10 according to the comparison result of the second voltage and the second reference voltage. The current sampling controller 13 is coupled to the voltage comparing unit 30, and is configured to adjust the peak value of the current with the first pulsating waveform by adjusting the voltage division ratio.

This embodiment is similar to the embodiment of FIG. 15, and the difference lies in that the voltage dividing unit is introduced in this embodiment. The voltage division ratio of the voltage dividing unit is adjustable. Further, in this embodiment, the current sampling controller 13 does not adjust the peak value of the current with the first pulsating waveform by adjusting the reference voltage of the voltage comparing unit 30. Instead, the current sampling controller 13 adjusts the peak value of the current with the first pulsating waveform by adjusting the voltage division ratio of the voltage dividing unit 34. In this embodiment, based on the voltage dividing unit, it does not only realize sampling the output voltage of the second adapter, but also realize adjusting the peak value of the current with the first pulsating waveform, which simplifies the circuit structure of the second adapter.

It should be understood that, in this embodiment, since the peak value of the current with the first pulsating waveform is adjusted by adjusting the voltage division ratio of the voltage dividing unit, the reference voltage of the voltage comparing unit (i.e., the second reference voltage) may be a fixed value.

There are many ways for implementing the voltage dividing unit 34 in embodiments of the present disclosure. For example, the above voltage division function and the function of adjusting the voltage division ratio can be achieved by the digital potentiometer or by elements such as separate resistors and switches.

Figure 18:
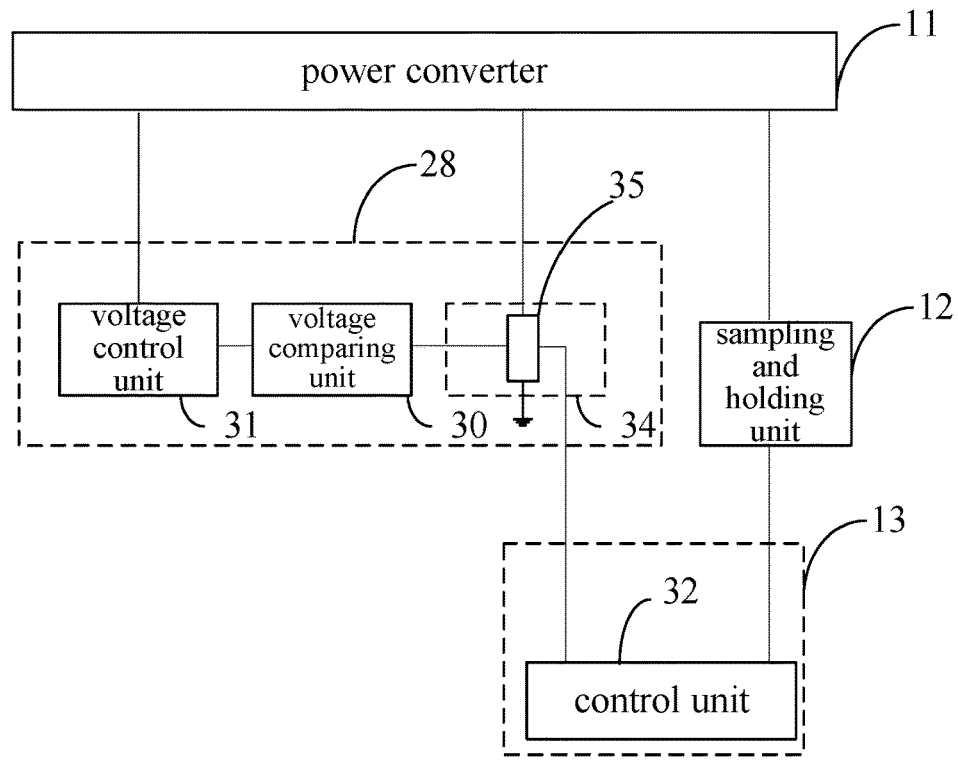
FIG. 18 a block diagram of a second adapter according to still yet another embodiment of the present disclosure.

Taking the digital potentiometer as an example, as illustrated in FIG. 18, the current sampling controller 13 includes a control unit 32, and the voltage dividing unit 34 includes a digital potentiometer 35. A high level end of the digital potentiometer 35 is coupled to the power converter 11. A low level end of the digital potentiometer 35 is grounded. An output end of the digital potentiometer 35 is coupled to the voltage comparing unit 30. The control unit 32 is coupled to a control end of the digital potentiometer 35, and is configured to adjust the voltage division ratio of the digital potentiometer 35 via the control end of the digital potentiometer 35, so as to adjust the peak value of the current with the first pulsating waveform.

Alternatively, in some embodiments, the second adapter 10 may support a first charging mode and a second charging mode. The charging speed of the second adapter 10 charging the device to be charged (such as the terminal) in the second charging mode is greater than the charging speed of the second adapter 10 charging the device to be charged (such as the terminal) in the first charging mode (the above current with the first pulsating waveform may be the output current of the second adapter in the second charging mode). In other words, compared to the second adapter 10 working in the first charging mode, the second adapter 10 working in the second charging mode can fully charge the battery having the same capacity in the device to be charged (such as the terminal) in a shorter time.

The second adapter 10 includes a control unit. During the connection of the second adapter 10 and the device to be charged (such as the terminal), the control unit performs a bidirectional communication with the device to be charged (such as the terminal), thus controlling the charging process of the second charging mode.

The first charging mode can be a normal charging mode and the second charging mode can be a quick charging mode. Under the normal charging mode, the second adapter outputs a relatively small current (typically less than 2.5 A) or charges the battery in the device to be charged (such as the terminal) with a relatively small power (typically less than 15 W). In the normal charging mode, it may take several hours to fully charge a larger capacity battery (such as a battery with 3000 mAh). In contrast, under the quick charging mode, the second adapter can output a relatively large current (typically greater than 2.5 A, such as 4.5 A, 5 A or higher) or charges the battery in the device to be charged (such as the terminal) with a relatively large power (typically greater than or equal to 15 W). Compared to the normal charging mode, the charging speed of the second adapter in the quick charging mode is faster, and the charging time required for fully charging a battery with the same capacity in the quick charging mode may be significantly shortened.

The content communicated between the control unit of the second adapter and the device to be charged (such as the terminal) is not limited in embodiments of the present disclosure, and the control manner of the control unit on the output of the second adapter in the second charging mode is also not limited in embodiments of the present disclosure. For example, the control unit may communicate with the device to be charged (such as the terminal) to exchange the present voltage or the present electric quantity of the battery in the device to be charged (such as the terminal), and adjust the output voltage or output current of the second adapter based on the present voltage or the present electric quantity of the battery. In the following, the content communicated between the control unit and the device to be charged (such as the terminal) and the control manner of the control unit on the output of the second adapter in the second charging mode will be described in detail in combination with specific embodiments.

Alternatively, in some embodiments, the control unit performs the bidirectional communication with the device to be charged (such as the terminal) to control the output of the second adapter in the second charging mode as follows. The control unit performs the bidirectional communication with the device to be charged (such as the terminal) to negotiate the charging mode between the second adapter and the device to be charged (such as the terminal).

In embodiments of the present disclosure, the second adapter does not quickly charge the device to be charged (such as the terminal) in the second charging mode blindly. Instead, the second adapter performs the bidirectional communication with the device to be charged (such as the terminal) to negotiate whether the second adapter can quickly charge the device to be charged (such as the terminal) in the second charging mode, thus improving the safety of the charging process.

In detail, the control unit performs the bidirectional communication with the device to be charged (such as the terminal) to negotiate the charging mode between the second adapter and the device to be charged (such as the terminal) as follows. The control unit sends a first instruction to the device to be charged (such as the terminal), in which the first instruction is configured to query the device to be charged (such as the terminal) whether to operate in the second charging mode. The control unit receives a reply instruction of the first instruction from the device to be charged (such as the terminal), in which the reply instruction of the first instruction is configured to indicate whether the device to be charged (such as the terminal) agrees to operate in the second charging mode. The control unit charges the device to be charged (such as the terminal) in the second charging mode when the device to be charged (such as the terminal) agrees to operate in the second charging mode.

The master-slave relation of the second adapter (or the control unit of the second adapter) and the device to be charged (such as the terminal) is not limited in embodiments of the present disclosure. In other words, any of the control unit and the device to be charged (such as the terminal) can be configured as the master device initiating the bidirectional communication session, accordingly, the other one can be configured as the slave device making a first response or a first reply to the communication initiated by the master device. As a feasible implementation, during the communication, the identifications of the master device and the slave device can be determined by comparing the electrical levels of the second adapter and the device to be charged (such as the terminal) relative to the ground.

The specific implementation of the bidirectional communication between the second adapter (or the control unit of the second adapter) and the device to be charged (such as the terminal) is not limited in embodiments of the present disclosure. In other words, any of the second adapter (or the control unit of the second adapter) and the device to be charged (such as the terminal) can be configured as the master device initiating the communication session, accordingly, the other one can be configured as the slave device making a first response or a first reply to the communication session initiated by the master device, and the master device is able to make a second response to the first response or the first reply of the slave device, and thus a negotiation about a charging mode can be realized between the master device and the slave device. As a feasible implementation, a charging operation between the master device and the slave device is performed after a plurality of negotiations about the charging mode are completed between the master device and the slave device, such that the charging process can be performed safely and reliably after the negotiation.

As an implementation, the mater device is able to make a second response to the first response or the first reply made by the slave device with regard to the communication session in a manner that, the master device is able to receive the first response or the first reply made by the slave device to the communication session and to make a targeted second response to the first response or the first reply. As an example, when the master device receives the first response or the first reply made by the slave device to the communication session in a predetermined time period, the master device makes the targeted second response to the first response or the first reply of the slave device in a manner that, the master device and the slave device complete one negotiation about the charging mode, and a charging process may be performed between the master device and the salve device in the first charging mode or the second charging mode according to a negotiation result, i.e., the second adapter charges the device to be charged (such as the terminal) in the first charging mode or the second charging mode according to a negotiation result.

As another implementation, the mater device is able to make a second response to the first response or the first reply made by the slave device to the communication session in a manner that, when the master device does not receive the first response or the first reply made by the slave device to the communication session in the predetermined time period, the mater device also makes the targeted second response to the first response or the first reply of the slave device. As an example, when the master device does not receive the first response or the first reply made by the slave device to the communication session in the predetermined time period, the mater device makes the targeted second response to the first response or the first reply of the slave device in a manner that, the master device and the slave device complete one negotiation about the charging mode, the charging process is performed between the mater device and the slave device in the first charging mode, i.e., the second adapter charges the device to be charged (such as the terminal) in the first charging mode.

In some embodiments, when the device to be charged (such as the terminal) is configured as the mater device initiating the communication session, after the second adapter (or the control unit of the second adapter) configured as the slave device makes the first response or the first reply to the communication session initiated by the master device, it is unnecessary for the device to be charged (such as the terminal) to make the targeted second response to the first response or the first reply of the second adapter, one negotiation about the charging mode is regarded as completed between the second adapter (or the control unit of the second adapter) and the device to be charged (such as the terminal), and the second adapter is able to charge the device to be charged (such as the terminal) in the first charging mode or the second charging mode according to the negotiation result.

In some embodiments, the control unit performs the bidirectional communication with the device to be charged (such as the terminal) to control the output of the second adapter in the second charging mode as follows. The control unit performs the bidirectional communication with the device to be charged (such as the terminal) to determine a charging voltage outputted by the second adapter in the second charging mode for charging the device to be charged (such as the terminal). The control unit adjusts the output voltage of the second adapter, such that the output voltage of the second adapter is equal to the charging voltage outputted by the second adapter in the second charging mode for charging the device to be charged (such as the terminal).

In detail, the control unit performs the bidirectional communication with the device to be charged (such as the terminal) to determine the charging voltage outputted by the second adapter in the second charging mode for charging the device to be charged (such as the terminal) as follows. The control unit sends a second instruction to the device to be charged (such as the terminal), in which the second instruction is configured to query whether the output voltage of the second adapter matches with a present voltage of a battery of the device to be charged (such as the terminal). The control unit receives a reply instruction of the second instruction sent from the device to be charged (such as the terminal), in which the reply instruction of the second instruction is configured to indicate that the output voltage of the second adapter matches with the present voltage of the battery, or is lower or higher than the present voltage of the battery. In another embodiment, the second instruction can be configured to query whether the present output voltage of the second adapter is suitable for being used as the charging voltage outputted by the second adapter in the second charging mode for charging the device to be charged (such as the terminal), and the reply instruction of the second instruction can be configured to indicate the present output voltage of the second adapter is suitable, high or low. When the present output voltage of the second adapter matches with the present voltage of the battery or the present output voltage of the second adapter is suitable for being used as the charging voltage outputted by the second adapter in the second charging mode for charging the device to be charged (such as the terminal), it indicates that the present output voltage of the second adapter is slightly higher than the present voltage of the battery, and a difference between the output voltage of the second adapter and the present voltage of the battery is within a predetermined range (typically in an order of hundreds of millivolts).

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine the charging current outputted by the second adapter in the second charging mode for charging the device to be charged (such as the terminal). The control unit adjusts the peak value of the current with the first pulsating waveform, such that the peak value of the current with the first pulsating waveform is equal to the charging current outputted by the second adapter in the second charging mode for charging the device to be charged.

In detail, the control unit may perform the bidirectional communication with the device to be charged (such as the terminal) to determine the charging current outputted by the second adapter in the second charging mode for charging the device to be charged (such as the terminal) as follows. The control unit sends a third instruction to the device to be charged (such as the terminal), in which the third instruction is configured to query a maximum charging current presently supported by the device to be charged (such as the terminal). The control unit receives a reply instruction of the third instruction sent from the device to be charged (such as the terminal), in which the reply instruction of the third instruction is configured to indicate the maximum charging current presently supported by the device to be charged (such as the terminal). The control unit determines the charging current outputted by the second adapter in the second charging mode for charging the device to be charged (such as the terminal) according to the maximum charging current presently supported by the device to be charged (such as the terminal). It should be understood that, the control unit can determine the charging current outputted by the second adapter in the second charging mode for charging the device to be charged (such as the terminal) based on the maximum charging current presently supported by the device to be charged (such as the terminal) in many ways. For example, the second adapter can determine the maximum charging current presently supported by the device to be charged (such as the terminal) as the charging current outputted by the second adapter in the second charging mode for charging the device to be charged (such as the terminal), or can determine the charging current outputted by the second adapter in the second charging mode for charging the device to be charged (such as the terminal) after comprehensively considering the maximum charging current presently supported by the device to be charged (such as the terminal) and its own current output capability.

In some embodiments, the control unit can perform the bidirectional communication with the device to be charged (such as the terminal) to control the output of the second adapter in the second charging mode as follows. During the second adapter charges the device to be charged (such as the terminal) in the second charging mode, the control unit performs the bidirectional communication with the device to be charged (such as the terminal) to adjust the peak value of the current with the first pulsating waveform.

In detail, the control unit can perform the bidirectional communication with the device to be charged (such as the terminal) to adjust the peak value of the current with the first pulsating waveform as follows. The control unit sends a fourth instruction to the device to be charged (such as the terminal), in which the fourth instruction is configured to query a present voltage of the battery in the device to be charged (such as the terminal). The control unit receives a reply instruction of the fourth instruction sent by the second adapter, in which the reply instruction of the fourth instruction is configured to indicate the present voltage of the battery. The control unit adjusts the peak value of the current with the first pulsating waveform according to the present voltage of the battery.

In some embodiments, as illustrated in FIG. 19A, the second adapter 10 includes a charging interface 191. Further, in some embodiments, the control unit (MCU as illustrated in FIG. 21) in the second adapter 10 can perform the bidirectional communication with the device to be charged (such as the terminal) via the data wire 192 of the charging interface 191.

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine whether the charging interface is in poor contact.

In detail, the control unit can perform the bidirectional communication with the device to be charged (such as the terminal) to determine whether the charging interface is in poor contact as follows. The control unit sends a fourth instruction to the device to be charged (such as the terminal), in which the fourth instruction is configured to query a present voltage of the battery in the device to be charged (such as the terminal). The control unit receives a reply instruction of the fourth instruction sent by the device to be charged (such as the terminal), in which the reply instruction of the fourth instruction is configured to indicate the present voltage of the battery in the device to be charged (such as the terminal). The control unit determines whether the charging interface is in poor contact according to the output voltage of the second adapter and the present voltage of the battery in the device to be charged (such as the terminal). For example, when the control unit determines that a voltage difference between the output voltage of the second adapter and the present voltage of the device to be charged (such as the terminal) is greater than a preset voltage threshold, it indicates that an impedance obtained by dividing the voltage difference by the present current value outputted by the second adapter is greater than a preset impedance threshold, and thus it can be determined that the charging interface is in poor contact.

In some embodiments, whether the charging interface is in poor contact can be determined by the device to be charged (such as the terminal). The device to be charged (such as the terminal) sends a sixth instruction to the control unit, in which the sixth instruction is configured to query the output voltage of the second adapter. The device to be charged (such as the terminal) receives a reply instruction of the sixth instruction (such as the terminal) sent by the control unit, in which the reply instruction of the sixth instruction is configured to indicate the output voltage of the second adapter. The device to be charged (such as the terminal) determines whether the charging interface is in poor contact according to the present voltage of the battery in the device to be charged (such as the terminal) and the output voltage of the second adapter. After the device to be charged (such as the terminal) determines that the charging interface is in poor contact, the device to be charged (such as the terminal) sends a fifth instruction to the control unit, the fifth instruction is configured to indicate that the charging interface is in poor contact. After receiving the fifth instruction, the control unit can control the second adapter to quit the second charging mode.

Figure 19B:
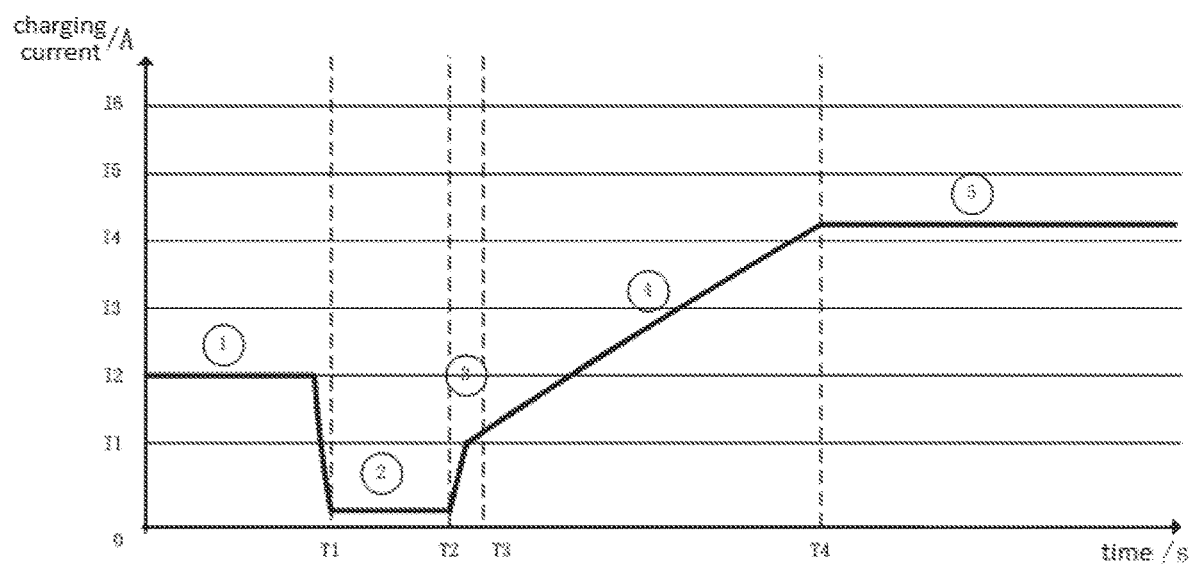
FIG. 19B is a schematic diagram illustrating a fast charging communication process according to an embodiment of the present disclosure.

Referring to FIG. 19B, the communication procedure between the control unit of the second adapter and the device to be charged (such as the terminal) will be described in detail. In an embodiment, examples in FIG. 19B are merely used to help those skilled in the related art understand the present disclosure. The embodiments shall not be limited to the specific numeric values or specific scenes. Apparently, various modifications and equivalents can be made by those skilled in the related art based on examples in FIG. 19B, and those modifications and equivalents shall fall within the protection scope of the present invention.

As illustrated in FIG. 19B, the charging process in which the output of the second adapter charges the device to be charged (such as the terminal) in the second charging mode may include the following five stages.

Stage 1:

After the device to be charged (such as the terminal) is coupled with a power supply providing device, the device to be charged (such as the terminal) may detect a type of the power supply providing device via the data wires D+ and D−. When detecting that the power supply providing device is the second adapter, the device to be charged (such as the terminal) may absorb a current greater than a predetermined current threshold I2, such as 1A. When the control unit in the second adapter detects that the output current of the second adapter is greater than or equal to I2 within a predetermined time period (such as a continuous time period T1), the control unit determines that the device to be charged (such as the terminal) has completed the recognition of the type of the power supply providing device. The control unit initiates a negotiation between the second adapter and the device to be charged (such as the terminal), and sends an instruction 1 (corresponding to the above-mentioned first instruction) to the device to be charged (such as the terminal) to query whether the device to be charged (such as the terminal) agrees that the second adapter charges the device to be charged (such as the terminal) in the second charging mode.

When the control unit receives a reply instruction of the instruction 1 sent from the device to be charged (such as the terminal) and the reply instruction of the instruction 1 indicates that the device to be charged (such as the terminal) disagrees that the second adapter charges the device to be charged (such as the terminal) in the second charging mode, the control unit detects the output current of the second adapter again. When the output current of the second adapter is still greater than or equal to I2 within a predetermined continuous time period (such as a continuous time period T1), the control unit sends the instruction 1 again to the device to be charged (such as the terminal) to query whether the device to be charged (such as the terminal) agrees that the second adapter charges the device to be charged (such as the terminal) in the second charging mode. The control unit repeats the above actions in stage 1, until the device to be charged (such as the terminal) agrees that the second adapter charges the device to be charged (such as the terminal) in the second charging mode or the output current of the second adapter is no longer greater than or equal to I2.

After the device to be charged (such as the terminal) agrees the second adapter to charge the device to be charged (such as the terminal) in the second charging mode, the communication procedure proceeds to stage 2.

Stage 2:

For the output voltage of the second adapter, there may be several levels. The control unit sends an instruction 2 (corresponding to the above-mentioned second instruction) to the device to be charged (such as the terminal) to query whether the output voltage (the present output voltage) of the second adapter matches with the present voltage of the battery in the device to be charged (such as the terminal).

The device to be charged (such as the terminal) sends a reply instruction of the instruction 2 to the control unit, for indicating that the output voltage of the second adapter matches with, or is higher or lower than the present voltage of the battery in the device to be charged (such as the terminal). When the reply instruction of the instruction 2 indicates that the output voltage of the adapter is higher, or lower, the control unit can adjust the output voltage of the second adapter by one level, and sends the instruction 2 to the device to be charged (such as the terminal) again to query whether the output voltage of the second adapter matches with the present voltage of the battery in the device to be charged (such as the terminal). The above actions in stage 2 are repeated, until the device to be charged (such as the terminal) determines that the output voltage of the second adapter matches with the present voltage of the battery in the device to be charged (such as the terminal). Then, the communication procedure proceeds to stage 3.

Stage 3:

The control unit sends an instruction 3 (corresponding to the above-mentioned third instruction) to the device to be charged (such as the terminal) to query the maximum charging current presently supported by the device to be charged (such as the terminal). The device to be charged (such as the terminal) sends a reply instruction of the instruction 3 to the control unit for indicating the maximum charging current presently supported by the device to be charged (such as the terminal), and then the communication procedure proceeds to stage 4.

Stage 4:

The control unit determines the charging current outputted by the second adapter in the second charging mode for charging the device to be charged (such as the terminal), according to the maximum charging current presently supported by the device to be charged (such as the terminal). Then, the communication procedure proceeds to stage 5, i.e., the constant current charging stage.

Stage 5:

When the communication procedure proceeds to the constant current charging stage, the control unit sends an instruction 4 (corresponding to the above-mentioned fourth instruction) to the device to be charged (such as the terminal) at intervals to query the present voltage of the battery in the device to be charged (such as the terminal). The device to be charged (such as the terminal) may send a reply instruction of the instruction 4 to the control unit, to feedback the present voltage of the battery in the device to be charged (such as the terminal). The control unit may determine according to the present voltage of the battery in the device to be charged (such as the terminal) whether the charging interface is in poor contact and whether it is necessary to step down the peak value of the current with the first pulsating waveform. When the second adapter determines that the charging interface is in poor contact, the second adapter sends an instruction 5 (corresponding to the abovementioned fifth instruction) to the device to be charged (such as the terminal), and the second adapter quits the second charging mode and then the communication procedure is reset and proceeds to stage 1 again.

In some embodiments of the present disclosure, in stage 1, when the device to be charged (such as the terminal) sends the reply instruction of the instruction 1, the reply instruction of the instruction 1 may carry data (or information) of the path impedance of the device to be charged (such as the terminal). The data of the path impedance of the device to be charged (such as the terminal) may be used in stage 5 to determine whether the charging interface is in poor contact.

In some embodiments of the present disclosure, in stage 2, the time period from when the device to be charged (such as the terminal) agrees that the second adapter charges the device to be charged (such as the terminal) in the second charging mode to when the control unit adjusts the output voltage of the second adapter to a suitable value may be controlled in a certain range. If the time period exceeds a predetermined range, the second adapter or the device to be charged (such as the terminal) may determine that the communication procedure is abnormal, and is reset and proceeds to stage 1.

In some embodiments, in stage 2, when the output voltage of the second adapter is higher than the present voltage of the battery in the device to be charged (such as the terminal) by $\Delta V$ ($\Delta V$ may be set to 200-500 mV), the device to be charged (such as the terminal) may send a reply instruction of the instruction 2 to the control unit, for indicating that the output voltage of the second adapter matches with the voltage of the battery in the device to be charged (such as the terminal).

In some embodiments of the present disclosure, in stage 4, the adjusting speed of the output current of the second adapter may be controlled to be in a certain range, thus in the charging process that the second adapter charges the device to be charged (such as the terminal) in the second charging mode, avoiding an abnormity occurring due to a too fast adjusting speed.

In some embodiments of the present disclosure, in stage 5, the variation degree of the output current of the second adapter may be controlled to be less than 5%.

In some embodiments of the present disclosure, in stage 5, the control unit can monitor the path impedance of a charging circuit in real time. In detail, the control unit can monitor the path impedance of the charging circuit according to the output voltage of the second adapter, the output current of the second adapter and the present voltage of the battery fed back by the device to be charged (such as the terminal). When the path impedance of the charging circuit is greater than a sum of the path impedance of the device to be charged (such as the terminal) and the impedance of a charging wire, it may be considered that the charging interface is in poor contact, and thus the second adapter stops charging the device to be charged (such as the terminal) in the second charging mode.

In some embodiments of the present disclosure, after the second adapter starts to charge the device to be charged (such as the terminal) in the second charging mode, time intervals of communication between the control unit and the device to be charged (such as the terminal) may be controlled to be in a certain range, thus avoiding abnormity in the communication procedure due to a too short time interval of communication.

In some embodiments of the present disclosure, the stop of the charging process (or the stop of the charging process that the second adapter charges the device to be charged (such as the terminal) in the second charging mode) may be a recoverable stop or an unrecoverable stop.

For example, when it is detected that the battery in the device to be charged (such as the terminal) is fully charged or the charging interface is in poor contact, the charging process is stopped and the charging communication procedure is reset, and the charging process proceeds to stage 1 again. When the device to be charged (such as the terminal) disagrees that the second adapter charges the device to be charged (such as the terminal) in the second charging mode, the communication procedure would not proceed to stage 2. The stop of the charging process in this case may be regarded as an unrecoverable stop.

For another example, when an abnormity occurs in the communication between the control unit and the device to be charged (such as the terminal), the charging process is stopped and the charging communication procedure is reset, and the charging process proceeds to stage 1 again. After requirements for stage 1 are met, the device to be charged (such as the terminal) agrees that the second adapter charges the device to be charged (such as the terminal) in the second charging mode to recover the charging process. In this case, the stop of the charging process may be considered as a recoverable stop.

For another example, when the device to be charged (such as the terminal) detects that an abnormity occurs in the battery, the charging process is stopped and reset, and the charging process proceeds to stage 1 again. The device to be charged (such as the terminal) disagrees that the second adapter charges the device to be charged (such as the terminal) in the second charging mode. When the battery returns to normal and the requirements for stage 1 are met, the device to be charged (such as the terminal) agrees that the second adapter charges the device to be charged (such as the terminal) in the second charging mode. In this case, the stop of quick charging process may be considered as a recoverable stop.

Communication actions or operations illustrated in FIG. 19B are merely exemplary. For example, in stage 1, after the device to be charged (such as the terminal) is coupled with the second adapter, the handshake communication between the device to be charged (such as the terminal) and the control unit may be initiated by the device to be charged (such as the terminal). In other words, the device to be charged (such as the terminal) sends an instruction 1 to query the control unit whether to operate in the second charging mode. When the device to be charged (such as the terminal) receives a reply instruction indicating that the control unit agrees that the second adapter charges the device to be charged (such as the terminal) in the second charging mode from the control unit, the second adapter starts to charge the battery in the device to be charged (such as the terminal) in the second charging mode.

For another example, after stage 5, there may be a constant voltage charging stage. In detail, in stage 5, the device to be charged (such as the terminal) may feedback the present voltage of the battery to the control unit. The charging process proceeds to the constant voltage charging stage from the constant current charging stage when the present voltage of the battery reaches a voltage threshold for constant voltage charging. During the constant voltage charging stage, the charging current steps down gradually. When the current reduces to a certain threshold, it indicates that the battery in the device to be charged (such as the terminal) is fully charged, and thus the charging process is stopped.

Figure 20:
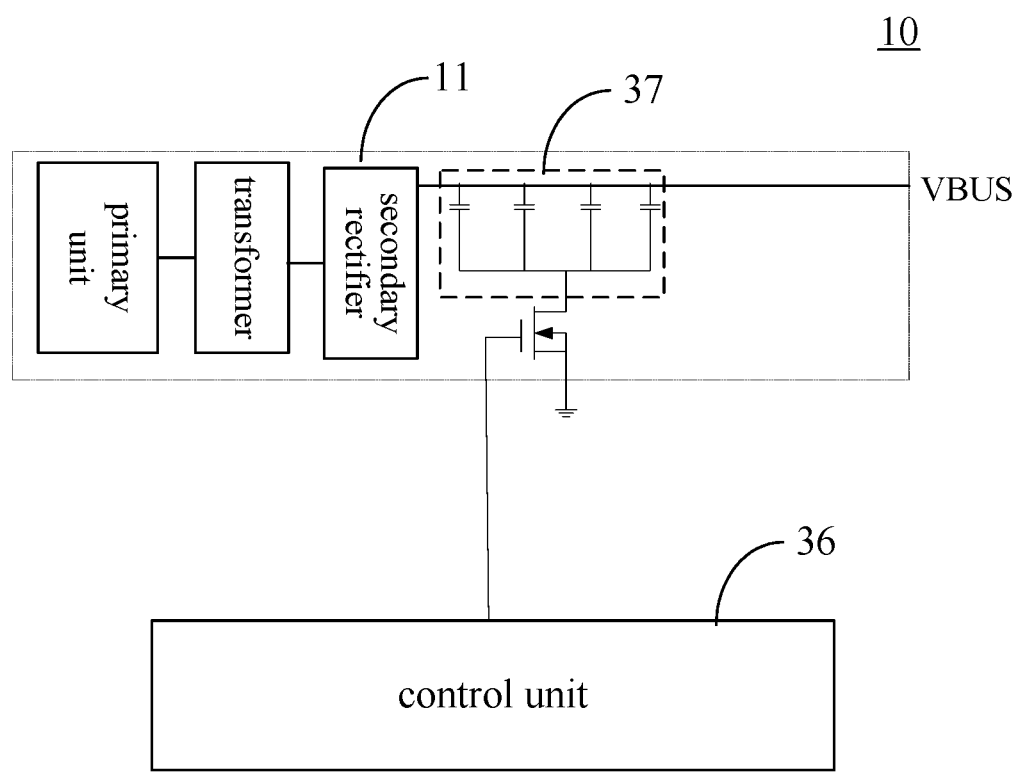
FIG. 20 is a block diagram of a second adapter according to yet another embodiment of the present disclosure.

Further, as illustrated in FIG. 20, based on any of the above embodiments, the second adapter 10 can support the first charging mode and the second charging mode, in which the charging speed of the second adapter charging the device to be charged (such as the terminal) in the second charging mode is greater than the charging speed of the second adapter charging the device to be charged (such as the terminal) in the first charging mode. The power converter 11 may include a secondary filtering unit 37, the second adapter 10 may include a control unit 36, and the control unit 36 is coupled to the secondary filtering unit 37. In the first charging mode, the control unit 36 controls the secondary filtering unit 37 to work, such that the voltage value of the output voltage of the second adapter 10 keeps constant. In the second charging mode, the control unit 36 controls the secondary filtering unit 37 to stop working, such that the output current of the second adapter 10 is the current with the first pulsating waveform.

In embodiments of the present disclosure, the control unit can control the secondary filtering unit to work or not, such that the second adapter can not only output the normal direct current with a constant current value, but can also output the pulsating direct current with varying current values, thus being compatible with the existing charging mode.

In some embodiments, the second adapter directly applies the current with the first pulsating waveform to the battery of the device to be charged (such as the terminal), for direct charging of the battery.

In detail, in the direct charging, the output voltage of the second adapter is directly applied (or directly introduced) to both ends of the battery in the device to be charged (such as the terminal) and the output current of the adapter is made to directly pass through the battery for charging the battery in the device to be charged (such as the terminal), and there is no need to convert the output current or output voltage of the second adapter by the converter in the intermediate process, thus avoiding energy loss due to the conversion process. During the charging process in the second charging mode, in order to adjust the charging voltage or charging current on the charging circuit, the second adapter can be designed as an intelligent adapter, which completes the conversion of the charging voltage or charging current, thus reducing the burden on the device to be charged (such as the terminal) and reducing the heat generated by the device to be charged.

The second adapter 10 according to embodiments of the present disclosure can work in the constant current mode. The constant current mode in the present disclosure refers to the charging mode in which the output current of the second adapter is controlled, rather than requiring the output current of the second adapter to be constant. In practice, the second adapter generally charges in a multi-stage constant current charging mode.

The multi-stage constant current charging has N charging stages, where N is an integer no less than 2. The multi-stage constant current charging can start the first-stage charging with a predetermined charging current. The N charging stages of the multi-stage constant current charging are executed in sequence from the first stage to the (N−1)th stage. When the charging proceeds to a next charging stage from a previous charging stage, the charging current value reduces. When the voltage of the battery reaches a charging stop voltage threshold, the charging proceeds to a next charging stage from a previous charging stage.

Further, in a case that the output current of the second adapter is the pulsating direct current, the constant current mode may refer to the charging mode in which the peak value or mean value of the pulsating direct current is controlled, i.e., the peak value of the output current of the second adapter is controlled to not exceed the current corresponding to the constant current mode.

Figure 22:
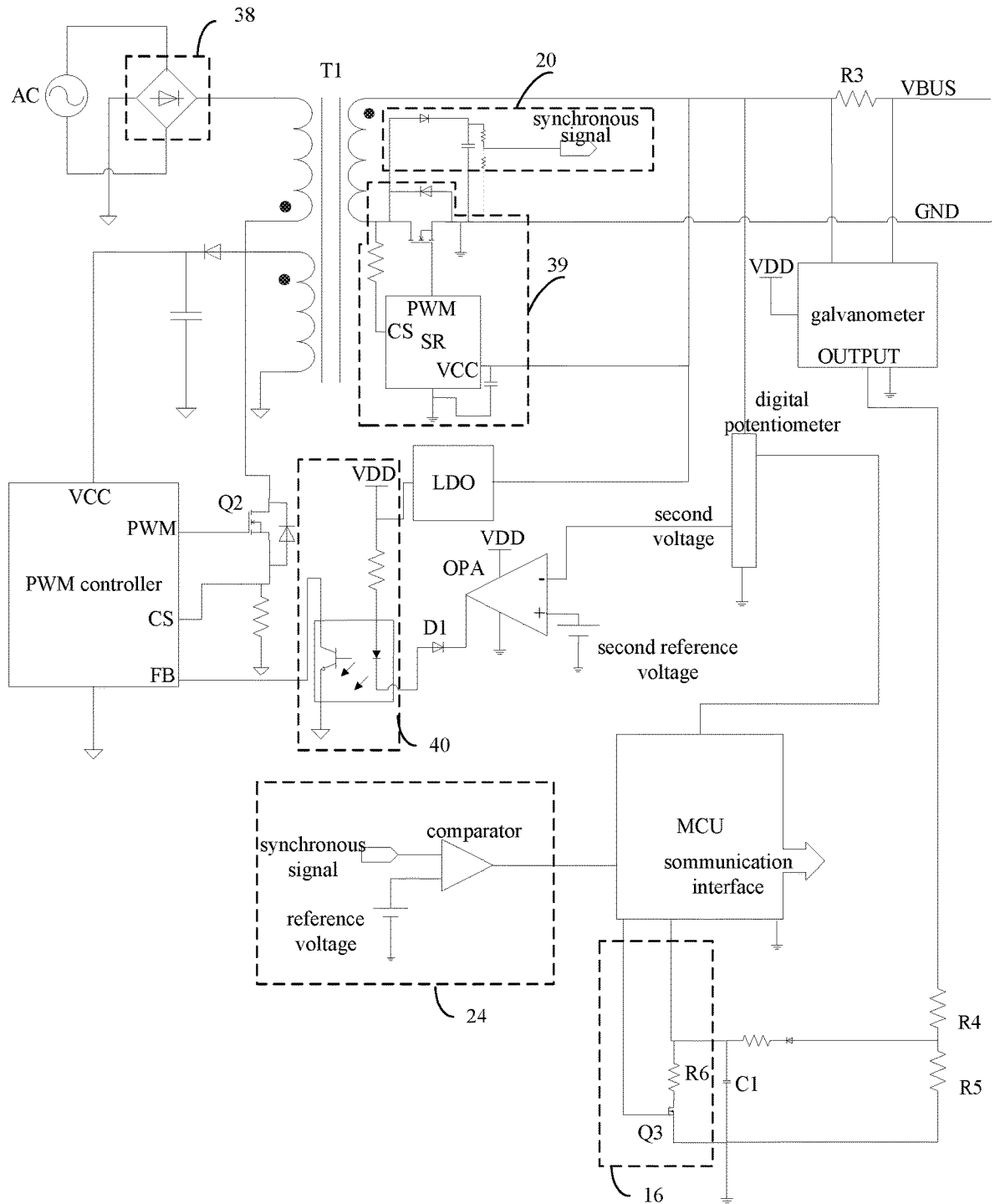
FIG. 22 is a schematic diagram illustrating a circuit of a second adapter according to another embodiment of the present disclosure.

Embodiments of the present disclosure will be described in detail below with specific examples. In an embodiment, the examples of FIG. 21 and FIG. 22 are merely used to help those skilled in the art understand embodiments of the present disclosure, but are not intended to limit embodiments of the present disclosure to specific values or specific scenes in the examples. Those skilled in the art can make various equivalent modification or change according to the examples given in FIG. 21 and FIG. 22, and such modification or change also falls within the scope of embodiments of the present disclosure.

The second adapter includes the power converter (corresponding to the above-mentioned power converter 11). As illustrated in FIG. 21, the power converter may include an input end of the alternating current AC, a primary rectifier 38, a transformer T1, a secondary rectifier 39 and a first rectifier 20.

In detail, the mains supply (which is generally 220V alternating current) is introduced via the input end of the alternating current AC, and then transmitted to the primary rectifier 38.

The primary rectifier 38 is configured to convert the mains supply into a current with a second pulsating waveform, and then transmit the current with the second pulsating waveform to the transformer T1. The primary rectifier 38 may be a bridge rectifier, for example, may be a full-bridge rectifier as illustrated in FIG. 21, or may be a half-bridge rectifier, which is not limited in embodiments of the present disclosure.

The transformer T1 is configured to couple the first pulsating direct current to the secondary side from the primary side. The transformer T1 may be a common transformer, or may be a high-frequency transformer having a working frequency of 50 KHz-2 MHz. The number and connection way of primary windings of the transformer T1 are related to the type of the switch power supply adopted in the second adapter, which is not limited in embodiments of the present disclosure. As illustrated in FIG. 21, the second adapter can adopt a flyback switch power supply, one end of the primary winding of the transformer is coupled to the primary rectifier 38, and the other end of the primary winding is coupled to the switch controlled by the PWM controller. Certainly, the second adapter can also adopt a forward switch power supply, or a push-pull switch power supply. For different types of switch power supplies, the primary rectifier and the transformer are coupled to each other in different ways, and for simplicity, elaboration is omitted here.

The secondary rectifier 39 is configured to rectify the current coupled to the secondary side from the primary side, to obtain the current with the first pulsating waveform. The secondary rectifier 39 may be implemented in many ways. FIG. 21 illustrates a typical secondary synchronous rectifier circuit. The synchronous rectifier circuit includes a SR (synchronous rectifier) chip, a MOS transistor controlled by the SR chip, and a diode coupled between a source and a drain of the MOS transistor. The SR chip sends a PWM control signal to a gate of the MOS transistor and controls the MOS transistor to switch on or off, thus realizing the synchronous rectifying of the secondary side.

The first rectifier 20 is configured to rectify the current coupled to the secondary side from the primary side, to obtain the synchronous signal. As illustrated in FIG. 21, the first rectifier 20 may be a forward rectifier circuit. The synchronous signal is the forward voltage outputted by the forward rectifier circuit.

Further, the second adapter may include a sampling and holding unit (corresponding to the above-mentioned sampling and holding unit 12). The sampling and holding unit includes a current sampling unit (corresponding to the above-mentioned current sampling unit 14) and a current holding unit (corresponding to the above-mentioned current holding unit 15).

In detail, as illustrated in FIG. 21, the current sampling unit specifically includes a current detecting resistor R3 and a galvanometer. The galvanometer detects the current with the first pulsating waveform via the current detecting resistor R3 to obtain the sampling current, and converts the sampling current to a corresponding sampling voltage (the sampling voltage is configured to indicate a magnitude of the current with the first pulsating waveform).

The current holding unit includes voltage dividing resistors R4 and R5 and a capacitor C1. The current holding unit firstly performs voltage division on the sampling voltage outputted from the output port of the galvanometer by the voltage dividing resistors R4 and R5, and then charges the capacitor C1 using the voltage obtained after the voltage division, such that the voltage across both ends of the capacitor C1 varies with the current with the first pulsating waveform. When the first pulsating waveform reaches the peak value or the falling edge, the voltage across both ends of the capacitor C1 reaches the maximum (corresponding to the peak value of the current with the first pulsating waveform), and the sampling and holding unit enters the holding state.

Further, the second adapter includes a current sampling controller (corresponding to the above-mentioned current sampling controller 13). The current sampling controller may include a MCU (corresponding to the above-mentioned control unit), a comparing unit 24 and a discharging unit 26.

In detail, the comparing unit 24 may include a comparator. A first input end of the comparator is configured to receive the synchronous signal. A second input end of the comparator is configured to receive the reference voltage. In some embodiments, the first input end is the non-inverting input end, and the second input end is the inverting input end. In other embodiments, the first input end is the inverting input end, and the second input end is the non-inverting input end. The comparator sends the comparison result to the MCU.

The MCU determines when the first pulsating waveform is at the peak value or in the falling edge based on the comparison result of the comparator. When the first pulsating waveform is at the peak value or in the falling edge, it indicates that the sampling and holding circuit is in the holding state. The MCU samples the voltage across both ends of the capacitor C1 via an ADC, and thus determines the peak value of the current with the first pulsating waveform.

The discharging unit 16 may include a switch transistor Q3 and a resistor R6. After the MCU samples the peak value of the current with the first pulsating waveform, the MCU controls the switch transistor Q3 to switch on, and the capacitor C1 discharges to the resistor R6, such that charges in the capacitor C1 are released. In this way, the voltage across both ends of the capacitor C1 can vary with the current with first pulsating waveform again, which indicates that the sampling and holding unit switches to the sampling state from the holding state.

Further, the second adapter may include a voltage adjusting unit (corresponding to the above-mentioned voltage adjusting unit 28). The voltage adjusting unit may include a voltage sampling unit (corresponding to the above mentioned voltage sampling unit 29), a voltage comparing unit (corresponding to the above-mentioned voltage comparing unit 30) and a voltage control unit (corresponding to the above-mentioned voltage control unit 31).

In detail, as illustrated in FIG. 21, the voltage sampling unit includes a resistor R1 and a resistor R2, which are configured to perform voltage division on the output voltage of the second adapter, to obtain a first voltage.

The voltage comparing unit includes an operational amplifier OPA. An inverting input end of the OPA is configured to receive the first voltage. A non-inverting input end of the OPA is coupled to the DAC, and is configured to receive a first reference voltage provided by the DAC. The DAC is coupled to the MCU. The MCU can adjust the first reference voltage via the DAC, and thus adjust the output current and/or output voltage of the second adapter.

The voltage control unit includes an optical coupling unit 40 and a PWM controller. An input end of the optical coupling unit 40 is coupled to an output end of the OPA. When the output voltage of the OPA is less than the working voltage VDD of the optical coupling unit 40, the optical coupling unit 40 starts to work, and provides the feedback voltage to the FB terminal of the PWM controller. The PWM controller controls the duty ratio of the PWM signal outputted from the PWM terminal by comparing the voltages of the CS terminal and the FB terminal. When the output voltage of the OPA is zero, the voltage of the FB terminal is stable, and the duty ratio of the PWM control signal outputted from the PWM terminal of the PWM controller keeps constant. The PWM terminal of the PWM controller is coupled to the primary winding of the transformer T1 via the switch transistor Q2, and is configured to control the output voltage and output current of the second adapter. When the duty ratio of the control signal sent from the PWM terminal is constant, the output voltage and output current of the second adapter keep stable.

Furthermore, the MCU may further include a communication interface. The MCU can perform the bidirectional communication with the device to be charged (such as the terminal) via the communication interface, so as to control the charging process of the second adapter. Taking the charging interface being an USB interface as an example, the communication interface may also be the USB interface. In detail, the second adapter can charge the device to be charged (such as the terminal) via the power wire of the USB interface, and communicate with the device to be charged (such as the terminal) via the data wire (D+ and/or D−) of the USB interface.

Furthermore, the optical coupling unit 40 can also be coupled to a voltage stabilizing unit, such that the working voltage of the optical coupler keeps stable. As illustrated in FIG. 21, the voltage stabilizing unit in embodiments of the present disclosure may be configured as an LDO (Low Dropout Regulator).

The embodiment of FIG. 22 is similar to the embodiment of FIG. 21, and differences lie in that, the voltage sampling unit consisting of the resistor R1 and the resistor R2 in FIG. 21 is replaced by a digital potentiometer (corresponding to the above-mentioned voltage dividing unit 34), the inverting input end of the OPA is coupled to a fixed second reference voltage, and the MCU adjusts the output voltage and output current of the second adapter by adjusting the voltage division ratio of the digital potentiometer. For example, if it is intended that the output voltage of the second adapter is 5V, the voltage division ratio of the digital potentiometer can be adjusted, such that the voltage at the output end of the digital potentiometer is equal to the second reference voltage when the output voltage of the second adapter is 5V. Similarly, if it is intended that the output voltage of the second adapter is 3V, the voltage division ratio of the digital potentiometer can be adjusted, such that the voltage at the output end of the digital potentiometer is equal to the second reference voltage when the output voltage of the second adapter is 3V.

In embodiments of FIG. 21 and FIG. 22, the synchronous signal is obtained by rectification of the first rectifier 20. However, the present disclosure is not limited to this, and the synchronous signal can be obtained from the primary side of the second adapter, as illustrated in FIG. 9. Or, the synchronous signal can be obtained from the sampling and holding unit, for example, from the output port (OUTPUT) of the galvanometer as illustrated in FIG. 21 and FIG. 22.

In embodiments of FIG. 21 and FIG. 22, the comparing unit 24 directly compares the synchronous signal with the reference voltage to determine whether the sampling and holding unit is in the holding state. However, the present disclosure is not limited to this. The implementation illustrated in FIG. 13 may also be adopted, which filters out the direct current signal in the synchronous signal by the capacitor to obtain the alternating current signal at zero crossing point, and then compares the alternating current signal at zero crossing point with the reference voltage to determine whether the sampling and holding unit is in the holding state.

In the present disclosure, the control units identified with different reference numbers may be control units separated from each other, or may be a same control unit. In some embodiments, the second adapter includes a MCU, and each control unit mentioned in the present disclosure refers to the MCU.

In the above, device embodiments of the present disclosure have been described in detail with reference to FIGS. 1-22. In the following, method embodiments of the present disclosure will be described in detail with reference to FIG. 23. It should be understood that, the description from the method side is corresponding to the description from the device side, and for simplicity, repeated description is omitted.

Figure 23:
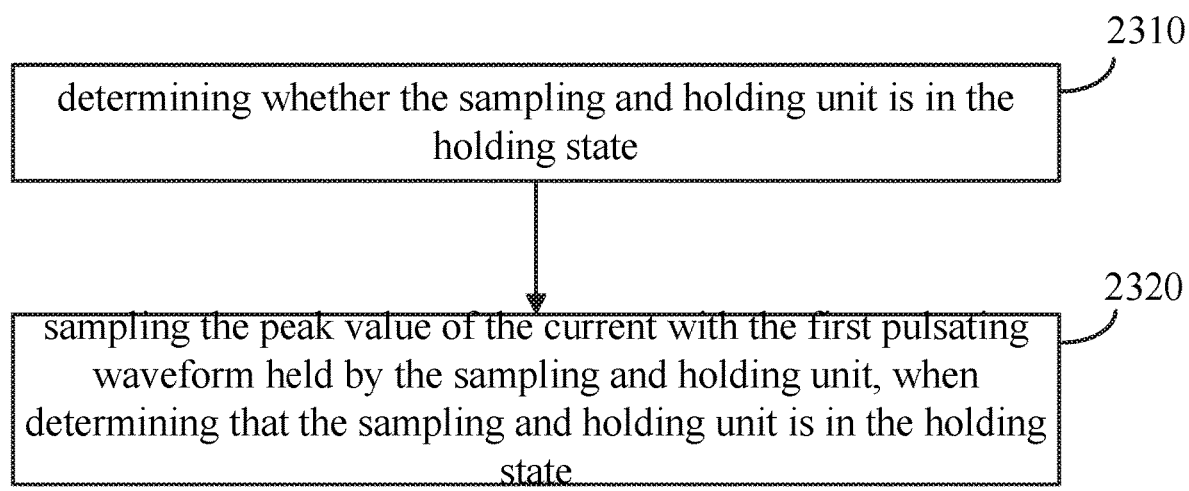
FIG. 23 is a flow chart of a charging control method according to an embodiment of the present disclosure.

FIG. 23 is a flow chart illustrating a charging control method according to an embodiment of the present disclosure. The method of FIG. 23 can be applied to a second adapter, for example, the second adapter as illustrated in FIGS. 1-22. The second adapter may include a power converter and a sampling and holding unit. The power converter can be configured to convert the input alternating current to obtain an output voltage and an output current of the second adapter. The output current of the second adapter is the current with the first pulsating waveform. The sampling and holding unit is coupled to the power converter. When the sampling and holding unit is in the sampling state, the sampling and holding unit is configured to sample the current with the first pulsating waveform. When the sampling and holding unit is in the holding state, the sampling and holding unit is configured to hold the peak value of the current with the first pulsating waveform.

The method of FIG. 23 includes following actions.

At block 2310, determining whether the sampling and holding unit is in the holding state.

At block 2320, when the sampling and holding unit is in the holding state, sampling the peak value of the current with the first pulsating waveform held by the sampling and holding unit.

In some embodiments, determining whether the sampling and holding unit is in the holding state may include: receiving a synchronous signal, in which a cycle of the synchronous signal is 1/N of a cycle of the first pulsating waveform, N is an integer greater than or equal to 1; and determining whether the sampling and holding unit is in the holding state based on the synchronous signal.

In some embodiments, receiving the synchronous signal includes: receiving the synchronous signal from the power converter.

In some embodiments, the power converter includes a primary unit and a secondary unit. Receiving the synchronous signal from the power converter may include: receiving the synchronous signal from the secondary unit.

In some embodiments, the secondary unit includes a first rectifier. The first rectifier is coupled to the current sampling controller. The first rectifier is configured to rectify the current coupled to the secondary unit from the primary unit to obtain a voltage with a second pulsating waveform, and send the voltage with the second pulsating waveform to the current sampling controller as the synchronous signal.

In some embodiments, the power converter may include a primary unit and a secondary unit. Receiving the synchronous signal from the power converter may include: receiving the synchronous signal from the primary unit.

In some embodiments, the primary unit is configured to rectify the alternating current to obtain a voltage with a third pulsating waveform. A cycle of the third pulsating waveform is the same as a cycle of the first pulsating waveform. The primary unit couples the voltage with the third pulsating waveform to the secondary side of the second adapter from the primary side of the second adapter via the optical coupling unit to obtain a voltage with a fourth pulsating waveform, and sends the voltage with the fourth pulsating waveform to the current sampling controller as the synchronous signal.

In some embodiments, receiving the synchronous signal may include: obtaining the synchronous signal from the sampling and holding unit.

In some embodiments, the sampling and holding unit is configured to sample the current with the first pulsating waveform to obtain a sampling current, convert the sampling current to a sampling voltage, and send the sampling voltage to the current sampling controller as the synchronous signal. The sampling voltage is configured to indicate a magnitude of the current with the first pulsating waveform.

In some embodiments, determining whether the sampling and holding unit is in the holding state based on the synchronous signal may include: determining whether the first pulsating waveform is at the peak value or in a falling edge based on the synchronous signal; and determining that the sampling and holding unit is in the holding state when determining that the first pulsating waveform is at the peak value or in the falling edge.

In some embodiments, determining whether the first pulsating waveform is at the peak value or in the falling edge based on the synchronous signal may include: determining whether the first pulsating waveform is at the peak value or in the falling edge based on a comparison result between a voltage of the synchronous signal and a reference voltage.

In some embodiments, determining whether the first pulsating waveform is at the peak value or in the falling edge based on the synchronous signal may include: filtering out a direct current signal in the synchronous signal to obtain an alternating current signal at zero crossing point; comparing a voltage of the alternating current signal and a reference voltage;

and determining whether the first pulsating waveform is at the peak value or in the falling edge based on a comparison result between the voltage of the alternating current signal and the reference voltage, in which a voltage value of the reference voltage is zero.

In some embodiments, the cycle of the first pulsating waveform is the same as the cycle of the synchronous signal.

In some embodiments, the method of FIG. 23 may further include: controlling the sampling and holding unit to switch to the sampling state from the holding state, after sampling the peak value of the current with the first pulsating waveform.

In some embodiments, the sampling and holding unit includes a capacitor, and the sampling and holding unit holds the peak value of the current with the first pulsating waveform based on the capacitor in the sampling and holding unit. Controlling the sampling and holding unit to switch to the sampling state from the holding state may include: releasing charges in the capacitor of the sampling and holding unit, such that the sampling and holding unit switches to the sampling state from the holding state.

In some embodiments, the second adapter further includes a voltage adjusting unit. The voltage adjusting unit is coupled to the power converter, and configured to detect and adjust the output voltage of the second adapter. The method of FIG. 23 may further include: adjusting the peak value of the current with the first pulsating waveform by the voltage adjusting unit.

In some embodiments, the voltage adjusting unit includes a voltage sampling unit, a voltage comparing unit and a voltage control unit. The voltage sampling unit is coupled to the power converter, and configured to sample the output voltage of the second adapter to obtain a first voltage. An input end of the voltage comparing unit is coupled to the voltage sampling unit. The voltage comparing unit is configured to compare the first voltage with a first reference voltage. An input end of the voltage control unit is coupled to an output end of the voltage comparing unit. An output end of the voltage control unit is coupled to the power converter. The voltage control unit controls the output voltage of the second adapter according to a comparison result of the first voltage and the first reference voltage. Adjusting the peak value of the current with the first pulsating waveform by the voltage adjusting unit may include: adjusting the peak value of the current with the first pulsating waveform by adjusting a voltage value of the first reference voltage.

In some embodiments, adjusting the peak value of the current with the first pulsating waveform by adjusting a voltage value of the first reference voltage may include: adjusting the peak value of the current with the first pulsating waveform by adjusting the voltage value of the first reference voltage via a digital DAC.

In some embodiments, the voltage adjusting unit includes a voltage dividing unit, a voltage comparing unit and a voltage control unit. An input end of the voltage dividing unit is coupled to the power converter. The voltage dividing unit is configured to perform voltage division on the output voltage of the second adapter based on a preset voltage division ratio, to generate a second voltage. An input end of the voltage comparing unit is coupled to an output end of the voltage dividing unit. The voltage comparing unit is configured to compare the second voltage with a second reference voltage. An input of the voltage control unit is coupled to the input end of the voltage comparing unit. An output end of the voltage control unit is coupled to the power converter. The voltage control unit controls the output voltage of the second adapter according to a comparison result of the second voltage and the second reference voltage. Adjusting the peak value of the current with the first pulsating waveform by the voltage adjusting unit may include: adjusting the peak value of the current with the first pulsating waveform by adjusting the voltage division ratio.

In some embodiments, the voltage dividing unit includes a digital potentiometer. A high level terminal of the digital potentiometer is coupled to the power converter. A low level terminal of the digital potentiometer is grounded. An output terminal of the digital potentiometer is coupled to the voltage comparing unit. Adjusting the peak value of the current with the first pulsating waveform by adjusting the voltage division ratio may include: adjusting the peak value of the current with the first pulsating waveform by adjusting the voltage division ratio of the digital potentiometer.

In some embodiments, the sampling and holding unit may include a current sampling unit and a current holding unit. The current sampling unit is coupled to the power converter, and configured to detect the current with the first pulsating waveform to obtain a sampling current, and to convert the sampling current to a sampling voltage. The sampling voltage is configured to indicate a magnitude of the current with the first pulsating waveform. The current holding unit is coupled to the current sampling unit and the current sampling controller respectively. The current holding unit receives the sampling voltage from the current sampling unit, and charges a capacitor in the current holding unit based on the sampling voltage. Sampling the peak value of the current with the first pulsating waveform held by sampling and holding unit may include: obtaining the peak value of the current with the first pulsating waveform by sampling the voltage across both ends of the capacitor in the sampling and holding unit.

In some embodiments, sampling the peak value of the current with the first pulsating waveform held by sampling and holding unit may include: sampling the peak value of the current with the first pulsating waveform based on an ADC.

In some embodiments, the second adapter supports a first charging mode and a second charging mode. A charging speed of the second adapter charging a device to be charged in the second charging mode is greater than a charging speed of the second adapter charging the device to be charged in the first charging mode. The current with the first pulsating waveform is the output current of the second adapter in the second charging mode. The method of FIG. 23 may further include: performing a bidirectional communication with the device to be charged during the second adapter is coupled with the device to be charged, so as to control an output of the second adapter in the second charging mode.

In some embodiments, performing the bidirectional communication with the device to be charged to control the output of the second adapter in the second charging mode may include: performing the bidirectional communication with the device to be charged to negotiate the charging mode between the second adapter and the device to be charged.

In some embodiments, performing the bidirectional communication with the device to be charged to negotiate the charging mode between the second adapter and the device to be charged may include: sending a first instruction to the device to be charged, in which the first instruction is configured to query the device to be charged whether to operate in the second charging mode; receiving a reply instruction of the first instruction from the device to be charged, in which the reply instruction of the first instruction is configured to indicate whether the device to be charged agrees to operate in the second charging mode; and charging the device to be charged in the second charging mode when the device to be charged agrees to operate in the second charging mode.

In some embodiments, performing the bidirectional communication with the device to be charged to control the output of the second adapter in the second charging mode may include: performing the bidirectional communication with the device to be charged to determine a charging voltage outputted by the second adapter in the second charging mode for charging the device to be charged; and adjusting the output voltage of the second adapter, such that the output voltage of the second adapter is equal to the charging voltage outputted by the second adapter in the second charging mode for charging the device to be charged.

In some embodiments, performing the bidirectional communication with the device to be charged to determine the charging voltage outputted by the second adapter in the second charging mode for charging the device to be charged may include: sending a second instruction to the device to be charged, in which the second instruction is configured to query whether the output voltage of the second adapter matches with a present voltage of a battery of the device to be charged; and receiving a reply instruction of the second instruction sent from the device to be charged, in which the reply instruction of the second instruction is configured to indicate that the output voltage of the adapter matches with the present voltage of the battery, or is lower or higher than the present voltage of the battery.

In some embodiments, performing the bidirectional communication with the device to be charged to control the output of the second adapter in the second charging mode may include: performing the bidirectional communication with the device to be charged to determine a charging current outputted by the second adapter in the second charging mode for charging the device to be charged; and adjusting the peak value of the current with the first pulsating waveform, such that the peak value of the current with the first pulsating waveform is equal to the charging current outputted by the second adapter in the second charging mode for charging the device to be charged.

In some embodiments, performing the bidirectional communication with the device to be charged to determine the charging current outputted by the second adapter in the second charging mode for charging the device to be charged may include: sending a third instruction to the device to be charged, in which the third instruction is configured to query a maximum charging current presently supported by the device to be charged; receiving a reply instruction of the third instruction sent from the device to be charged, in which the reply instruction of the third instruction is configured to indicate the maximum charging current presently supported by the device to be charged; and determining the charging current outputted by the second adapter in the second charging mode for charging the device to be charged according to the maximum charging current presently supported by the device to be charged.

In some embodiments, performing the bidirectional communication with the device to be charged to control the output of the second adapter in the second charging mode may include: during charging in the second charging mode, performing the bidirectional communication with the device to be charged to adjust the peak value of the current with the first pulsating waveform.

In some embodiments, performing the bidirectional communication with the device to be charged to adjust the peak value of the current with the first pulsating waveform may include: sending a fourth instruction to the device to be charged, in which the fourth instruction is configured to query a present voltage of the battery in the device to be charged; receiving a reply instruction replying the fourth instruction sent by the second adapter, in which the reply instruction of the fourth instruction is configured to indicate the present voltage of the battery in the device to be charged; and adjusting the peak value of the current with the first pulsating waveform according to the present voltage of the battery.

In some embodiments, the second adapter includes a charging interface, and the second adapter performs the bidirectional communication with the device to be charged via a data wire of the charging interface.

In some embodiments, the second adapter supports a first charging mode and a second charging mode, in which the first charging mode is a constant voltage mode, and the second charging mode is a constant current mode. The current with the first pulsating waveform is the output current of the second adapter in the second charging mode. The second adapter includes a control unit. The power converter includes a secondary filtering unit. The control unit is coupled to the secondary filtering unit. The method of FIG. 23 may further include: in the first charging mode, controlling the secondary filtering unit to work, such that the voltage value of the output voltage of the second adapter is constant; and in the second charging mode, controlling the secondary filtering unit to stop working, such that the output current of the second adapter is the current with the first pulsating waveform.

In some embodiments, the second adapter directly applies the current with the first pulsating waveform to the battery in the device to be charged, for direct charging of the battery.

In some embodiments, the second adapter is configured to charge a mobile terminal.

In some embodiments, the second adapter includes a control unit configured to control a charging process, in which the control unit is a MCU.

In some embodiments, the second adapter includes a charging interface, and the charging interface is a USB interface.

It should be understood that, "first adapter" and "second adapter" in the present disclosure are merely for convenient description, and are not intended to limit specific types of the adapter according to embodiments of the present disclosure.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present disclosure.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manner.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An adapter, supporting a first charging mode and a second charging mode, the first charging mode being a constant voltage mode, the second charging mode being a constant current mode; in the second charging mode, an output voltage of the adapter being directly applied to both ends of a battery of a device to be charged and an output current of the adapter being made to directly pass through the battery for direct charging of the battery, and the adapter comprising:
   a power converter, configured to convert input alternating current to obtain the output voltage and the output current of the adapter, wherein the output current of the adapter is a current with a first pulsating waveform;
   a sampling and holding unit, coupled to the power converter, and configured to sample the current with the first pulsating waveform in a sampling state, and to hold a peak value of the current with the first pulsating waveform in a holding state;
   a current sampling controller, coupled to the sampling and holding unit, and configured to determine whether the sampling and holding unit is in the holding state, and to sample the peak value of the current with the first pulsating waveform held by the sampling and holding unit when the sampling and holding unit is in the holding state.

2. The adapter according to claim 1, wherein the current sampling controller is configured to receive a synchronous signal, and to determine whether the sampling and holding unit is in the holding state based on the synchronous signal, in which a cycle of the synchronous signal is 1/N of a cycle of the first pulsating waveform, N is an integer greater than or equal to 1.

3. The adapter according to claim 2, wherein the current sampling controller is configured to obtain the synchronous signal from the sampling and holding unit, wherein the sampling and holding unit is configured to sample the current with the first pulsating waveform to obtain a sampling current, to convert the sampling current to a sampling voltage, and to send the sampling voltage to the current sampling controller as the synchronous signal, in which the sampling voltage is configured to indicate a magnitude of the current with the first pulsating waveform.

4. The adapter according to claim 2, wherein the current sampling controller is configured to determine whether the first pulsating waveform is at the peak value or in a falling edge based on the synchronous signal, and to sample the peak value of the current with the first pulsating waveform held by the sampling and holding unit when determining that the first pulsating waveform is at the peak value or in the falling edge.

5. The adapter according to claim 4, wherein the current sampling controller comprises:
   a comparator, wherein a first input end of the comparator is configured to receive the synchronous signal, and a second input end of the comparator is configured to receive a reference voltage; and
   a control unit, coupled to an output end of the comparator, and configured to determine whether the first pulsating waveform is at the peak value or in the falling edge based on a comparison result between a voltage of the synchronous signal and the reference voltage.

6. The adapter according to claim 4, wherein the current sampling controller comprises:
   a comparing unit, comprising a capacitor and a comparator, in which the capacitor is configured to receive the synchronous signal and to filter out a direct current signal in the synchronous signal to obtain an alternating current signal at zero crossing point, a first input end of the comparator is coupled to the capacitor and configured to receive the alternating current signal, a second input end of the comparator is configured to receive a reference voltage, and the comparator is configured to compare a voltage of the alternating current signal with the reference voltage; and
   a control unit, coupled to an output end of the comparator, and configured to determine whether the first pulsating waveform is at the peak value or in the falling edge based on a comparison result between the voltage of the synchronous signal and the reference voltage, in which a voltage value of the reference voltage is zero.

7. The adapter according to claim 2, wherein the cycle of the first pulsating waveform is same with the cycle of the synchronous signal.

8. The adapter according to claim 1, wherein the current sampling controller is further configured to control the sampling and holding unit to switch to the sampling state from the holding state after the peak value of the current with the first pulsating waveform is sampled by the current sampling controller.

9. The adapter according to claim 8, wherein the sampling and holding unit comprises a capacitor, and the sampling and holding unit is configured to hold the peak value of the current with the first pulsating waveform based on the capacitor in the sampling and holding unit;

the current sampling controller comprises a discharging unit and a control unit, the discharging unit is coupled to the control unit and the capacitor in the sampling and holding unit respectively, and configured to the release charges in the capacitor of the sampling and holding unit under a control of the control unit, such that the sampling and holding unit switches to the sampling state from the holding state.

10. The adapter according to claim 1, further comprising:

a voltage adjusting unit, coupled to the power converter, and configured to detect and adjust the output voltage of the adapter, wherein the current sampling controller is coupled to the voltage adjusting unit, and configured to adjust the peak value of the current with the first pulsating waveform by the voltage adjusting unit.

11. The adapter according to claim 1, wherein the sampling and holding unit comprises:

a current sampling unit, coupled to the power converter, and configured to detect the current with the first pulsating waveform to obtain a sampling current, and to convert the sampling current to a sampling voltage, the sampling voltage indicating a magnitude of the current with the first pulsating waveform;

a current holding unit, coupled to the current sampling unit and the current sampling controller respectively, and configured to receive the sampling voltage from the current sampling unit, and to charge a capacitor in the current holding unit based on the sampling voltage, wherein the current sampling controller is configured to sample the peak value of the current with the first pulsating waveform based on a voltage across both ends of the capacitor in the sampling and holding unit.

12. The adapter according to claim 1, wherein the current sampling controller comprises an analog-to-digital converter, and the current sampling controller is configured to sample the peak value of the current with the first pulsating waveform based on the analog-to-digital converter.

13. The adapter according to claim 1, wherein a charging speed of the adapter charging the device to be charged in the second charging mode is greater than a charging speed of the adapter charging the device to be charged in the first charging mode, the current with the first pulsating waveform is the output current of the adapter in the second charging mode, the adapter comprises a control unit, and the control unit is configured to perform a bidirectional communication with the device to be charged during the adapter is coupled with the device to be charged, so as to control an output of the adapter in the second charging mode.

14. The adapter according to claim 13, wherein when the control unit performs the bidirectional communication with the device to be charged to control the output of the adapter in the second charging mode, the control unit is configured to perform the bidirectional communication with the device to be charged to negotiate a charging mode between the adapter and the device to be charged;

wherein when the control unit performs the bidirectional communication with the device to be charged to negotiate the charging mode between the adapter and the device to be charged, the control unit is configured to send a first instruction to the device to be charged, in which the first instruction is configured to query the device to be charged whether to operate in the second charging mode;

the control unit is configured to receive a reply instruction of the first instruction from the device to be charged, in which the reply instruction of the first instruction is configured to indicate whether the device to be charged agrees to operate in the second charging mode; and the control unit is configured to charge the device to be charged in the second charging mode when the device to be charged agrees to operate in the second charging mode.

15. The adapter according to claim 13, wherein when the control unit performs the bidirectional communication with the device to be charged to control the output of the adapter in the second charging mode, the control unit is configured to perform the bidirectional communication with the device to be charged to determine a charging voltage outputted by the adapter in the second charging mode for charging the device to be charged; and the control unit is configured to adjust the output voltage of the adapter, such that the output voltage of the adapter is equal to the charging voltage outputted by the adapter in the second charging mode for charging the device to be charged;

wherein when the control unit performs the bidirectional communication with the device to be charged to determine the charging voltage outputted by the adapter in the second charging mode for charging the device to be charged, the control unit is configured to send a second instruction to the device to be charged, in which the second instruction is configured to query whether the output voltage of the adapter matches with a present voltage of the battery of the device to be charged; and the control unit is configured to receive a reply instruction of the second instruction sent from the device to be charged, in which the reply instruction of the second instruction is configured to indicate that the output voltage of the adapter matches with the present voltage of the battery, or is lower or higher than the present voltage of the battery.

16. The adapter according to claim 13, wherein when the control unit performs the bidirectional communication with the device to be charged to control the output of the adapter in the second charging mode, the control unit is configured to perform the bidirectional communication with the device to be charged to determine a charging current outputted by the adapter in the second charging mode for charging the device to be charged; and the control unit is configured to adjust the peak value of the current with the first pulsating waveform, such that the peak value of the current with the first pulsating waveform is equal to the charging current outputted by the adapter in the second charging mode for charging the device to be charged;

wherein when the control unit performs the bidirectional communication with the device to be charged to determine the charging current outputted by the adapter in the second charging mode for charging the device to be charged, the control unit is configured to send a third instruction to the device to be charged, in which the third instruction is configured to query a maximum charging current presently supported by the device to be charged;

the control unit is configured to receive a reply instruction of the third instruction sent from the device to be charged, in which the reply instruction of the third instruction is configured to indicate the maximum charging current presently supported by the device to be charged; and the control unit is configured to determine the charging current outputted by the adapter in the second charging mode for charging the device to be charged according to the maximum charging current presently supported by the device to be charged.

17. The adapter according to claim 13, wherein when the control unit performs the bidirectional communication with the device to be charged to control the output of the adapter in the second charging mode, the control unit is configured to perform the bidirectional communication with the device to be charged during charging in the second charging mode, to adjust the peak value of the current with the first pulsating waveform;

wherein when the control unit performs the bidirectional communication with the device to be charged to adjust the peak value of the current with the first pulsating waveform, the control unit is configured to send a fourth instruction to the device to be charged, in which the fourth instruction is configured to query a present voltage of the battery in the device to be charged;

the control unit is configured to receive a reply instruction replying the fourth instruction sent by the adapter, in which the reply instruction of the fourth instruction is configured to indicate the present voltage of the battery in the device to be charged; and the control unit is configured to adjust the peak value of the current with the first pulsating waveform according to the present voltage of the battery.

18. A charging control method, wherein the method is applied in an adapter; the adapter supports a first charging mode and a second charging mode, the first charging mode is a constant voltage mode, and the second charging mode is a constant current mode; in the second charging mode, an output voltage of the adapter are directly applied to both ends of a battery of a device to be charged and an output current of the adapter being made to directly pass through the battery for direct charging of the battery; the adapter comprises a power converter and a sampling and holding unit; the power converter is configured to convert input alternating current to obtain an output voltage and an output current of the adapter, the output current of the adapter being a current with a first pulsating waveform; the sampling and holding unit is coupled to the power converter, and configured to sample the current with the first pulsating waveform in a sampling state, and to hold a peak value of the current with the first pulsating waveform in a holding state; the method comprises:

determining whether the sampling and holding unit is in the holding state; and sampling the peak value of the current with the first pulsating waveform held by the sampling and holding unit when determining that the sampling and holding unit is in the holding state.

19. A charging system, comprising an adapter and a device to be charged; wherein, the adapter supports a first charging mode and a second charging mode, the first charging mode being a constant voltage mode, the second charging mode being a constant current mode; in the second charging mode, an output voltage of the adapter is directly applied to both ends of a battery of a device to be charged and an output current of the adapter is made to directly pass through the battery for direct charging of the battery;

the adapter comprises:

a power converter, configured to convert input alternating current to obtain an output voltage and an output current of the adapter, wherein the output current of the adapter is a current with a first pulsating waveform;

a sampling and holding unit, coupled to the power converter, and configured to sample the current with the first pulsating waveform in a sampling state, and to hold a peak value of the current with the first pulsating waveform in a holding state;

a current sampling controller, coupled to the sampling and holding unit, and configured to determine whether the sampling and holding unit is in the holding state, and to sample the peak value of the current with the first pulsating waveform held by the sampling and holding unit when the sampling and holding unit is in the holding state.

\* \* \* \* \*